(12) United States Patent
Nakao et al.

(10) Patent No.: US 6,351,410 B1
(45) Date of Patent: Feb. 26, 2002

(54) FERROMAGNETIC TUNNEL JUNCTION RANDOM ACCESS MEMORY, SPIN VALVE RANDOM ACCESS MEMORY, SINGLE FERROMAGNETIC LAYER RANDOM ACCESS MEMORY, AND MEMORY CELL ARRAY USING THE SAME

(75) Inventors: Hiroshi Nakao; Yoshimi Yamashita; Naoto Horiguchi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/660,940

(22) Filed: Sep. 13, 2000

(30) Foreign Application Priority Data

Sep. 17, 1999 (JP) .......................................... 11-264430

(51) Int. Cl.$^7$ ............................................... G11C 11/14
(52) U.S. Cl. ........................... 365/171; 365/173; 365/66
(58) Field of Search ................................ 365/171, 173, 365/159, 176, 66, 50

(56) References Cited

U.S. PATENT DOCUMENTS

| 5,477,482 | A | | 12/1995 | Prinz | |
|---|---|---|---|---|---|
| 6,055,179 | A | * | 4/2000 | Koganei et al. | 365/158 |
| 6,104,632 | A | * | 8/2000 | Nishimura | 365/158 |
| 6,111,784 | A | * | 8/2000 | Nishimura | 365/173 |
| 6,219,275 | B1 | * | 4/2001 | Nishimura | 365/173 |

FOREIGN PATENT DOCUMENTS

JP 9-509775 9/1997

OTHER PUBLICATIONS

Journal of Applied Physics—1999 American Institute of Physics, vol. 35, No. 8, Apr. 15, 1999; pp. 5828–5833. (Discussed in the specification).

* cited by examiner

Primary Examiner—David Nelms
Assistant Examiner—Thong Le
(74) Attorney, Agent, or Firm—Armstrong, Westerman, Hattori, McLeland & Naughton, LLP

(57) ABSTRACT

A ferromagnetic tunnel junction random access memory includes a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers; a conductor plug penetrating the first ferromagnetic layer, the tunnel insulator layer and the second ferromagnetic layer along a center axis; a first selection line coupled to a first end of the conductor plug; and a second selection line coupled to a second end of the conductor plug opposite to the first end. The first ferromagnetic layer has a generally ring shape surrounding the conductor plug and is insulated from the conductor plug. One of the first and second ferromagnetic layers has an antiferromagnetic layer pattern on a portion thereof.

35 Claims, 21 Drawing Sheets

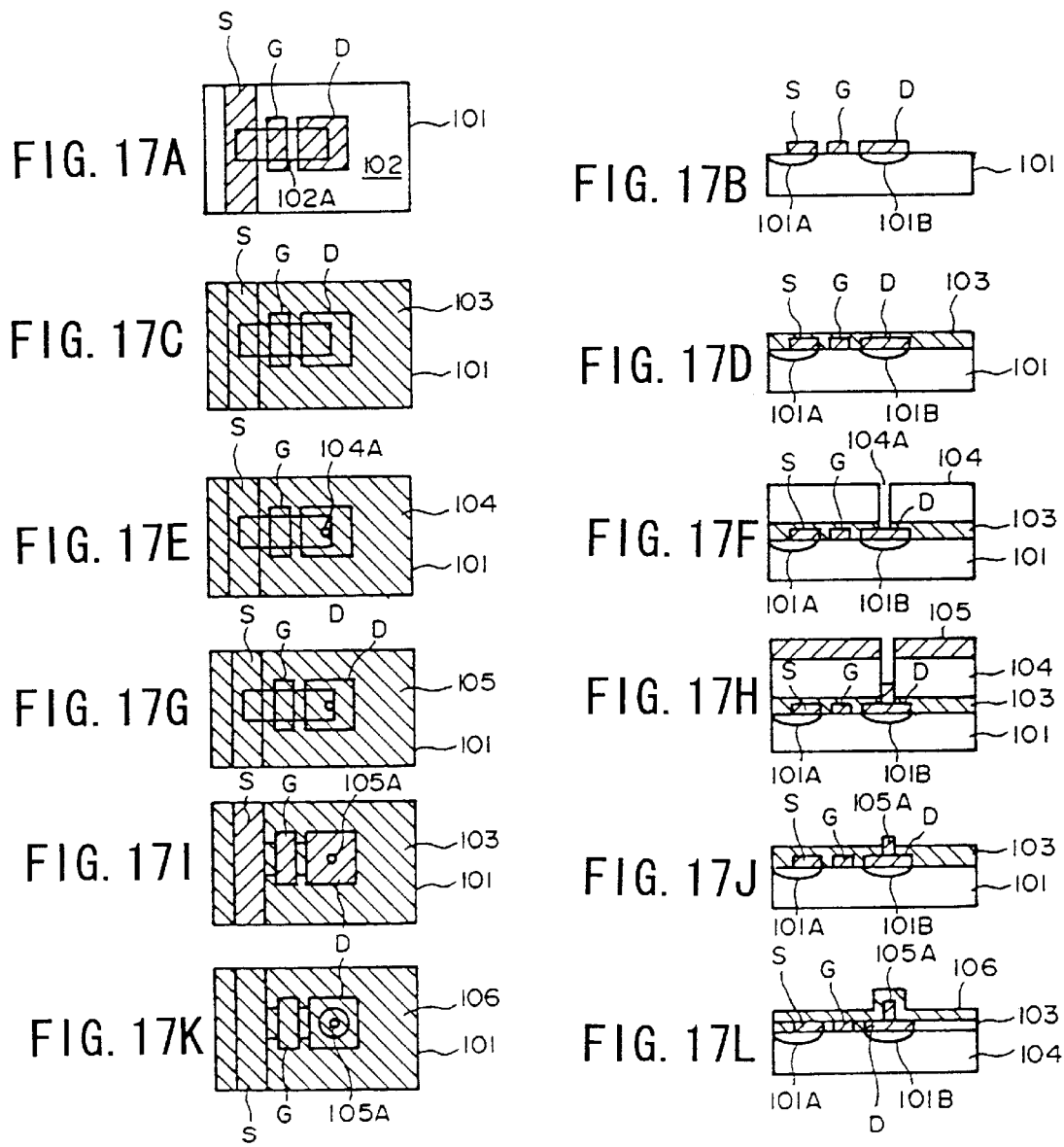

FERROMAGNETIC TUNNEL JUNCTION RANDOM ACCESS MEMORY, SPIN VALVE RANDOM ACCESS MEMORY, SINGLE FERROMAGNETIC LAYER RANDOM ACCESS MEMORY, AND MEMORY CELL ARRAY USING THE SAME

BACKGROUND OF THE INVENTION

This application claims the benefit of a Japanese Patent Application No. 11-264430 filed Sep. 17, 1999, in the Japanese Patent Office, the disclosure of which is hereby incorporated by reference.

1. Field of the Invention

The present invention generally relates to magnetic memories, and more particularly to a ferromagnetic random access memory and a memory cell array using the same.

The random access memory is essential for use as a main storage of an information processing apparatus such as a computer. Conventionally, the random access memory is formed by a semiconductor memory device such as a DRAM, but it is possible to form the random access memory by a magnetic random access memory using magnetoresistance. The magnetic random access memory has a simple structure in which a nonmagnetic layer made of an insulator or a conductor is sandwiched between a pair of ferromagnetic layers, and this simple structure enables miniaturization to suit integration. Generally, such a magnetic random access memory is nonvolatile and has a good response characteristic. Accordingly, the magnetic random access memory is regarded as being suited for use as a memory of an ultra high-speed computer which will be developed in the future. For example, the magnetic random access memory is described in Parkin et al., "Exchange-biased magnetic tunnel junctions and application to nonvolatile magnetic random access memory (invited)", Journal of Applied Physics, Vol. 85, No. 8, pp.5828–5833, Apr. 15, 1999.

2. Description of the Related Art

FIG. 1 is a diagram showing the structure of a conventional magnetic random access memory using a ferromagnetic tunnel junction proposed in Parkin et al.

In a magnetic random access memory (MRAM) 10 shown in FIG. 1, a pinning layer 11 which is made of an antiferromagnetic material is formed on a word line (pattern) WL which extends in a row direction, and a pinned layer 12 which is made of a ferromagnetic material is formed on the pinning layer 11. In the ferromagnetic pinned layer 12, a magnetization direction is fixed, that is, pinned, in a direction of an arrow, by the antiferromagnetic pinning layer 11 provided thereunder. Furthermore, a nonmagnetic tunnel insulator layer 13 and a free layer 14 which is made of a ferromagnetic material are successively formed on the ferromagnetic pinned layer 12, and a bit line (pattern) BL which extends in a column direction is formed on the ferromagnetic free layer 14. The ferromagnetic free layer 14 is magnetized in a direction indicated by an arrow or, in an opposite direction, by a combined magnetic field which is formed by a write current which flows through the word line WL and the bit line BL. In other words, in the MRAM 10, information is written in the form of the magnetization of the ferromagnetic free layer 14.

On the other hand, a magnetoresistance of a ferromagnetic tunnel junction formed by the ferromagnetic pinned layer 12, the ferromagnetic free layer 14 and the nonmagnetic tunnel insulator layer 13 interposed therebetween is used when reading the information written in the MRAM 10.

More particularly, spin polarization is generated within conduction electrons within a ferromagnetic layer such as the ferromagnetic free layer 14 and the ferromagnetic pinned layer 12, and the number of up-spin electrons and the number of down-spin electrons differ. In a case where the magnetization directions of the ferromagnetic free layer 14 and the ferromagnetic pinned layer 12 are parallel, the up-spin electrons or the down-pin electrons within the ferromagnetic free layer 14 can tunnel through the nonmagnetic tunnel insulator layer 13 at a vacancy level of the electrons existing within the ferromagnetic pinned layer 12 and having a corresponding spin state, and the ferromagnetic tunnel junction has a low resistance. On the other hand, in a case where the magnetization directions of the ferromagnetic free layer 14 and the ferromagnetic pinned layer 12 are antiparallel, a vacancy level corresponding to the up-spin electrons or the down-spin electrons within the ferromagnetic free layer 14 does not exist within the ferromagnetic pinned layer 12, and for this reason, the tunneling of the electrons does not occur within the nonmagnetic tunnel insulator layer 13. In other words, when the ferromagnetic free layer 14 and the ferromagnetic pinned layer 12 are magnetically antiparallel, the ferromagnetic tunnel junction has a large resistance.

Accordingly, in the MRAM 10 shown in FIG. 1, it is possible to read the information written in the ferromagnetic free layer 14 by detecting a voltage across the word line WL and the bit line BL. The information which is written within the ferromagnetic free layer 14 in the form of the magnetization is held even if a power supply is turned OFF, and as a result, the MRAM 10 forms a nonvolatile memory. In addition, the magnetization of the ferromagnetic free layer 14 will not be reversed even if the resistance is detected, and a nondestructive read can be made from the MRAM 10.

On the other hand, when the MRAM 10 shown in FIG. 1 is further miniaturized, a ratio of the surface area with respect to the volume of the magnetic material increases, and due to the effects of a closure magnetic field which is generated by the magnetization of the ferromagnetic free layer 14 or the ferromagnetic pinned layer 12 as shown in FIG. 2A, magnetic domains are generated in the ferromagnetic free layer 14 or the ferromagnetic pinned layer 12 as shown in FIG. 2B. When such magnetic domains are generated, an apparent magnetization as a whole is lost, and the ferromagnetic tunnel junction cannot operate.

In order to avoid this problem, it is necessary to use a material having a large coercivity for the ferromagnetic pinned layer 12 or the ferromagnetic free layer 14. However, a large current is required to write the information if such a material having the large coercivity is used for the ferromagnetic pinned layer 12 or the ferromagnetic free layer 14. For example, in order to generate a magnetic field on the order of approximately 10 Oe which is required to reverse the magnetization by a current supplied to the word line WL which is formed at a position 100 nm from the MRAM 10 shown in FIG. 1, for example, it is necessary to use a current on the order of several mA. However, when such a large current is supplied to the word line WL which is formed by a 0.1 $\mu$m rule, a current density becomes on the order of $10^7$ A/cm$^2$.

On the other hand, a conventional MRAM shown in FIG. 3 which is suited for miniaturization is proposed in a U.S. Pat. No. 5,477,482.

A spin valve MRAM 20 shown in FIG. 3 has a stacked structure similar to that of the MRAM 10 shown in FIG. 1. The spin valve MRAM 20 shown in FIG. 3 includes a disk-shaped antiferrromagnetic pinning layer 21 formed on a word line (pattern) WL, a disk-shaped ferromagnetic pinned layer 22 formed on the pinning layer 21, a ring-shaped ferromagnetic free layer 24 formed above the ferromagnetic pinned layer 22, and a non-magnetic conductor layer 23 interposed between the ferromagnetic pinned layer 22 and the ferromagnetic free layer 24. A bit line (pattern) BL is formed on the ferromagnetic free layer 24, in a direction intersecting the word line (pattern) WL. In this spin valve MRAM, a magnetoresistance observed between the word line (pattern) WL and the bit line (pattern) BL changes depending on the magnetization direction of the ferromagnetic free layer 24, as a result of the scattering which is dependent upon the direction of the spin of the electrons generated at an interface of the ferromagnetic pinned layer 22 and the nonmagnetic conductor layer 23 and at an interface of the nonmagnetic conductor layer 23 and the ferromagnetic free layer 24.

According to the spin valve MRAM 20 having the structure shown in FIG. 3, the ferromagnetic pinned layer 22 and the ferromagnetic free layer 24 both have the disk shape. Hence, when the ferromagnetic pinned layer 22 and the ferromagnetic free layer 24 are magnetized along the circumferential direction clockwise or counterclockwise, the direction of the closure magnetic field matches the magnetization direction, and the magnetic domains described above in conjunction with FIG. 2 will not be formed even when the spin valve MRAM 20 is miniaturized.

On the other hand, according to the spin valve MRAM 20 shown in FIG. 3, the ferromagnetic pinned layer 22, the ferromagnetic free layer 24, the antiferromagnetic pinning layer 21 and the nonmagnetic conductor layer 23 are all conductor layers. For this reason, a resistance between the bit line BL and the word line WL is small, and there is a problem in that a large current becomes necessary in order to detect the magnetoresistance when reading the written information.

Moreover, in the spin valve MRAM 20 shown in FIG. 3, there is a problem in that it is difficult to set the magnetization of the ferromagnetic pinned layer 22 in a desired circumferential direction. In other words, since the antiferromagnetic pinning layer 21 is formed with respect to the entire lower main surface of the ferromagnetic pinned layer 22, the magnetization direction is simply fixed in one direction when the magnetization direction of the ferromagnetic pinned layer 22 is fixed by the magnetization of the antiferromagnetic pinning layer 21 in a state where an external magnetic field is applied on the spin valve MRAM 20. Consequently, the magnetization of the ferromagnetic pinned layer 22 cannot be made along the desired circumferential direction.

SUMMARY OF THE INVENTION

Accordingly, it is a general object of the present invention to provide a novel and useful ferromagnetic tunnel junction random access memory, spin valve random access memory, single ferromagnetic layer random access memory, and memory cell array using the same, in which the problems described above are eliminated.

Another and more specific object of the present invention is to provide a ferromagnetic tunnel junction random access memory, spin valve random access memory, single ferromagnetic layer random access memory, and memory cell array using the same, which are suited for miniaturization, easy to produce, and display a large change in resistance.

Still another object of the present invention is to provide a ferromagnetic tunnel junction random access memory comprising: a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers; a conductor plug penetrating the first ferromagnetic layer, the tunnel insulator layer and the second ferromagnetic layer along a center axis; a first selection line coupled to a first end of the conductor plug; and a second selection line coupled to a second end of the conductor plug opposite to the first end, the first ferromagnetic layer having a generally ring shape surrounding the conductor plug and being insulated from the conductor plug, one of the first and second ferromagnetic layers having an antiferromagnetic layer pattern on a portion thereof. According to the ferromagnetic tunnel junction random access memory of the present invention, a pinning layer which fixes the magnetization direction of a pinned layer is formed not on the entire surface of the pinned layer but only on a portion thereof, so that the magnetization direction of the pinned layer can be set in a circumferential direction which surrounds a write current path penetrating a ferromagnetic tunnel junction. Hence, the magnetization direction of the pinned layer can be set in the clockwise or counterclockwise direction with respect to the write current, thereby enabling miniaturization to an extent which was conventionally impossible due to the effects of the closure magnetic field. In addition, when using the ferromagnetic tunnel junction, the resistance of the memory increases due to the effects of the tunnel insulator layer, and as a result, the write current and the read current can be reduced to enable reduction in the power consumption of the memory.

A further object of the present invention is to provide a ferromagnetic tunnel junction random access memory comprising: a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers; a conductor plug penetrating the first ferromagnetic layer, the tunnel insulator layer and the second ferromagnetic layer along a center axis; a first selection line coupled to a first end of the conductor plug; and a second selection line coupled to a second end of the conductor plug opposite to the first end, the first ferromagnetic layer having a generally ring shape surrounding the conductor plug and being insulated from the conductor plug, one of the first and second ferromagnetic layers having a coercivity larger than that of the other of the first and second ferromagnetic layers. According to the ferromagnetic tunnel junction random access memory of the present invention, a pinning layer which fixes the magnetization direction of a pinned layer is formed not on the entire surface of the pinned layer but only on a portion thereof, so that the magnetization direction of the pinned layer can be set in a circumferential direction which surrounds a write current path penetrating a ferromagnetic tunnel junction. Hence, the magnetization direction of the pinned layer can be set in the clockwise or counterclockwise direction with respect to the write current, thereby enabling miniaturization to an extent which was conventionally impossible due to the effects of the closure magnetic field. In addition, when using the ferromagnetic tunnel junction, the resistance of the memory increases due to the effects of the tunnel insulator layer, and as a result, the write current and the read current can be reduced to enable reduction in the power consumption of the memory.

Another object of the present invention is to provide a spin valve random access memory comprising: a spin valve junction structure including a first ferromagnetic layer, a second ferromagnetic layer disposed adjacent to the first ferromagnetic layer and having a fixed magnetization, and a nonmagnetic conductor layer interposed between the first and second ferromagnetic layers; a conductor plug extending along a center axis within the spin valve junction structure by penetrating the first ferromagnetic layer, the nonmagnetic conductor layer and the second ferromagnetic layer; a first selection line coupled to a first end of the conductor plug; a second selection line coupled to a second end of the conductor plug opposite to the first end; a third selection line coupled to a first position on a sidewall surface of the spin valve junction structure; and a fourth selection line coupled to a second position on the sidewall surface of the spin valve junction structure confronting to the first position, the first ferromagnetic layer having a generally ring shape surrounding the conductor plug and being insulated from the conductor plug, one of the first and second ferromagnetic layers having an antiferromagnetic layer pattern disposed thereon. According to the spin valve random access memory of the present invention, a pinning layer which fixes the magnetization direction of a pinned layer is formed not on the entire surface of the pinned layer but only on a portion thereof, so that the magnetization direction of the pinned layer can be set in a circumferential direction which surrounds a write current path penetrating a ferromagnetic tunnel junction. Hence, the magnetization direction of the pinned layer can be set in the clockwise or counterclockwise direction with respect to the write current, thereby enabling miniaturization to an extent which was conventionally impossible due to the effects of the closure magnetic field. In addition, when using the spin valve junction, a current path during a read operation mode is formed parallel to the surface of the ferromagnetic layer, and as a result, it is possible to prevent the power consumption of the memory from becoming large due to an excessively small resistance as was the case of the conventional spin valve random access memory which forms a current path perpendicularly to the ferromagnetic layer.

Still another object of the present invention is to provide a spin valve random access memory comprising: a spin valve junction structure including a first ferromagnetic layer, a second ferromagnetic layer disposed adjacent to the first ferromagnetic layer and having a fixed magnetization, and a nonmagnetic conductor layer interposed between the first and second ferromagnetic layers; a conductor plug extending along a center axis within the spin valve junction structure by penetrating the first ferromagnetic layer, the nonmagnetic conductor layer and the second ferromagnetic layer; a first selection line coupled to a first end of the conductor plug; a second selection line coupled to a second end of the conductor plug opposite to the first end; a third selection line coupled to a first position on a sidewall surface of the spin valve junction structure; and a fourth selection line coupled to a second position on the sidewall surface of the spin valve junction structure confronting to the first position, the first ferromagnetic layer having a generally ring shape surrounding the conductor plug and being insulated from the conductor plug, one of the first and second ferromagnetic layers having a coercivity larger than that of the other of the first and second ferromagnetic layers. According to the spin valve random access memory of the present invention, a pinning layer which fixes the magnetization direction of a pinned layer is formed not on the entire surface of the pinned layer but only on a portion thereof, so that the magnetization direction of the pinned layer can be set in a circumferential direction which surrounds a write current path penetrating a ferromagnetic tunnel junction. Hence, the magnetization direction of the pinned layer can be set in the clockwise or counterclockwise direction with respect to the write current, thereby enabling miniaturization to an extent which was conventionally impossible due to the effects of the closure magnetic field. In addition, when using the spin valve junction, a current path during a read operation mode is formed parallel to the surface of the ferromagnetic layer, and as a result, it is possible to prevent the power consumption of the memory from becoming large due to an excessively small resistance as was the case of the conventional spin valve random access memory which forms a current path perpendicularly to the ferromagnetic layer.

A further object of the present invention is to provide a single ferromagnetic layer random access memory comprising: a ferromagnetic layer; a conductor plug penetrating a central portion of the ferromagnetic layer; a first selection line coupled to a first end of the conductor plug; and a second selection line coupled to a second end of the conductor plug opposite to the first end, the ferromagnetic layer having a generally ring shape surrounding the conductor plug and being insulated from the conductor plug. According to the single ferromagnetic layer random access memory of the present invention, the structure is extremely simple and the number of selection lines can be minimized. Hence, the single ferromagnetic layer random access memory is suited for improving the integration density of a memory cell array which uses memory cells made up of such a single ferromagnetic layer random access memory.

Another object of the present invention is to provide a memory cell array comprising: memory cells disposed in a matrix arrangement, each of the memory cells comprising a ferromagnetic tunnel junction random access memory comprising: a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers; a conductor plug penetrating the first ferromagnetic layer, the tunnel insulator layer and the second ferromagnetic layer along a center axis; a first selection line coupled to a first end of the conductor plug; a second selection line coupled to a second end of the conductor plug opposite to the first end; and a third selection line disposed on and electrically connected to the first ferromagnetic layer at a position avoiding the conductor plug, the first ferromagnetic layer having a generally ring shape surrounding the conductor plug and being insulated from the conductor plug, one of the first and second ferromagnetic layers having an antiferromagnetic layer pattern on a portion thereof or, having a coercivity larger than the other of the first and second ferromagnetic layers, the second selection line comprising a conductor pattern which electrically connects the second end of the conductor plug and the second ferromagnetic layer; a first common selection line extending in a first direction within the memory cell array; a second common selection line extending in the first direction within the memory cell array in parallel to the first common selection line; a third common selection line extending in a second direction different from the first direction within the memory cell array; and a switch coupled between the third common selection line and the second selection line with respect to each of the memory cells, a first group of memory cells arranged in the first direction having the first selection line coupled to the first common selection line and the third selection line coupled to the second common selection line, a second group of memory cells arranged in the second direction having the second selection line coupled to the third common selection line. According to the memory cell array of the present invention, it is possible to supply a write current and a read current to only a selected memory cell by simply providing a switch such as a transistor with respect to each of the memory cells.

Still another object of the present invention is to provide a memory cell array comprising: memory cells disposed in a matrix arrangement, each of the memory cells comprising a first diode, a second diode, and a ferromagnetic tunnel junction random access memory comprising: a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers; a conductor plug penetrating the first ferromagnetic layer, the tunnel insulator layer and the second ferromagnetic layer along a center axis; a first selection line coupled to a first end of the conductor plug; a second selection line coupled to a second end of the conductor plug opposite to the first end; a third selection line disposed on and electrically connected to the first ferromagnetic layer at a position avoiding the conductor plug; and a fourth selection line disposed on and electrically connected to the second ferromagnetic layer at a position avoiding the conductor plug, the first ferromagnetic layer having a generally ring shape surrounding the conductor plug and being insulated from the conductor plug, one of the first and second ferromagnetic layers having an antiferromagnetic layer pattern on a portion thereof or, having a coercivity larger than the other of the first and second ferromagnetic layers, a first common selection line extending in a first direction within the memory cell array; a second common selection line extending in the a second direction different from the first direction within the memory cell array; a switch coupled between the third common selection line and the second selection line with respect to each of the memory cells, a first group of memory cells arranged in the first direction having the second and fourth selection lines coupled to the second common selection line, a second group of memory cells arranged in the second direction having the second selection line coupled to the third common selection line, the first diode being coupled between the second common selection line and the second selection line, the second diode being coupled between the second common selection line and the fourth selection line, the first and second diodes having mutually different characteristics. According to the memory cell array of the present invention, it is possible to supply a write current and a read current to only a selected memory cell by simply providing a nonlinear element such as a diode with respect to each of the memory cells.

A further object of the present invention is to provide a memory cell array comprising: memory cells disposed in a matrix arrangement, each of the memory cells comprising a first diode, a second diode, and a spin valve random access memory comprising: a spin valve junction structure including a first ferromagnetic layer, a second ferromagnetic layer disposed adjacent to the first ferromagnetic layer and having a fixed magnetization, and a nonmagnetic conductor layer interposed between the first and second ferromagnetic layers; a conductor plug extending along a center axis within the spin valve junction structure by penetrating the first ferromagnetic layer, the nonmagnetic conductor layer and the second ferromagnetic layer; a first selection line coupled to a first end of the conductor plug; a second selection line coupled to a second end of the conductor plug opposite to the first end; a third selection line coupled to a first position on a sidewall surface of the spin valve junction structure; and a fourth selection line coupled to a second position on the sidewall surface of the spin valve junction structure confronting to the first position, the first ferromagnetic layer having a generally ring shape surrounding the conductor plug and being insulated from the conductor plug, one of the first and second ferromagnetic layers having an antiferromagnetic layer pattern disposed thereon; a first common selection line extending in a first direction within the memory cell array; and a second common selection line extending in a second direction different from the first direction within the memory cell array, a first group of memory cells arranged in the first direction having the first and third selection lines coupled to the first common selection line, a second group of memory cells arranged in the second direction having the second and fourth selection lines coupled to the second common selection line, the first diode being coupled between the second common selection line and the second selection line, the second diode being coupled between the second common selection line and the fourth selection line, the first and second diodes having mutually different characteristics. According to the memory cell array of the present invention, it is possible to supply a write current and a read current to only a selected memory cell by simply providing a nonlinear element such as a diode with respect to each of the memory cells.

Another object of the present invention is to provide a memory cell array comprising: memory cells disposed in a matrix arrangement, each of the memory cells comprising a diode, and a single ferromagnetic layer random access memory comprising: a ferromagnetic layer; a conductor plug penetrating a central portion of the ferromagnetic layer; a first selection line coupled to a first end of the conductor plug; and a second selection line coupled to a second end of the conductor plug opposite to the first end, the ferromagnetic layer having a generally ring shape surrounding the conductor plug and being insulated from the conductor plug; a first common selection line extending in a first direction within the memory cell array; and a second common selection line extending in a second direction different from the first direction within the memory cell array, a first group of memory cells arranged in the first direction having the first selection line coupled to the first common selection line, a second group of memory cells arranged in the second direction having the second selection line coupled to the second common selection line, the diode being coupled between the second common selection line and the second selection line. According to the memory cell array of the present invention, it is possible to supply a write current and a read current to only a selected memory cell by simply providing a transistor or a nonlinear element such as a diode with respect to each of the memory cells.

Other objects and further features of the present invention will be apparent from the following detailed description when read in conjunction with the accompanying drawings.

BRIEF DESCRIPTION OF THE DRAWINGS

FIGS. 17A through 17L are diagrams for explaining a method of producing the second embodiment of the memory cell array;

DESCRIPTION OF THE PREFERRED EMBODIMENTS

Figure 1:
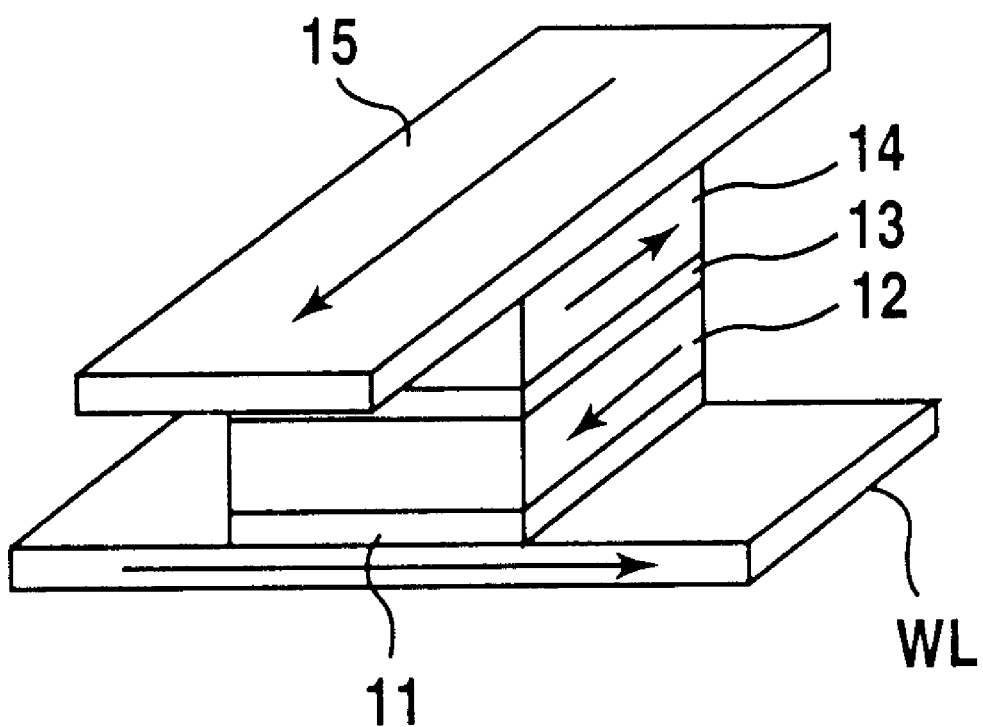
FIG. 1 is a diagram showing the structure of a conventional magnetic random access memory.
Figure 2A:
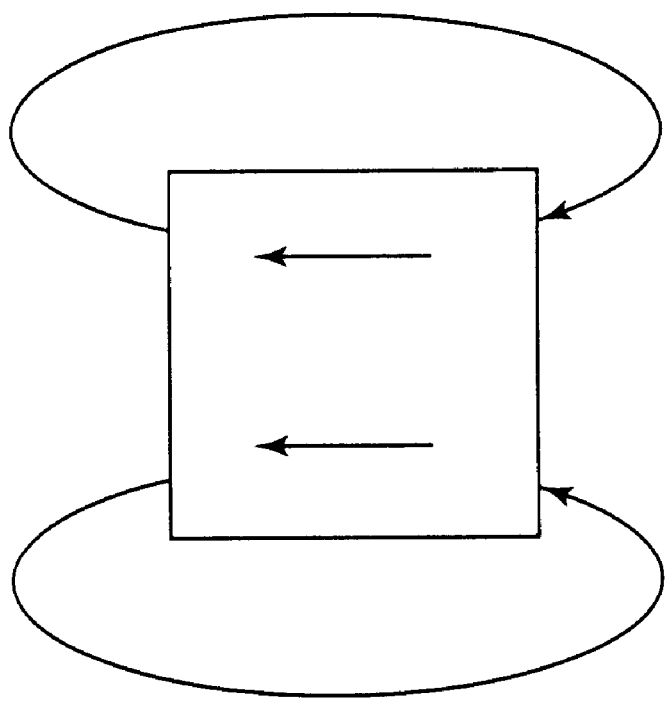
FIGS. 2A and 2B are diagrams for explaining the problems of the conventional magnetic random access memory shown in FIG. 1.
Figure 2B:
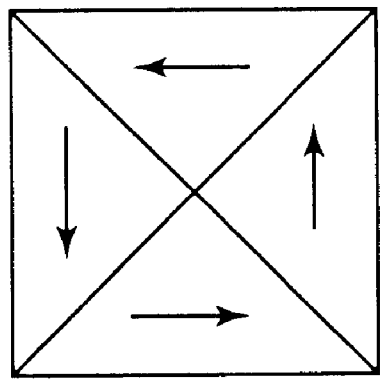
Figure 3:
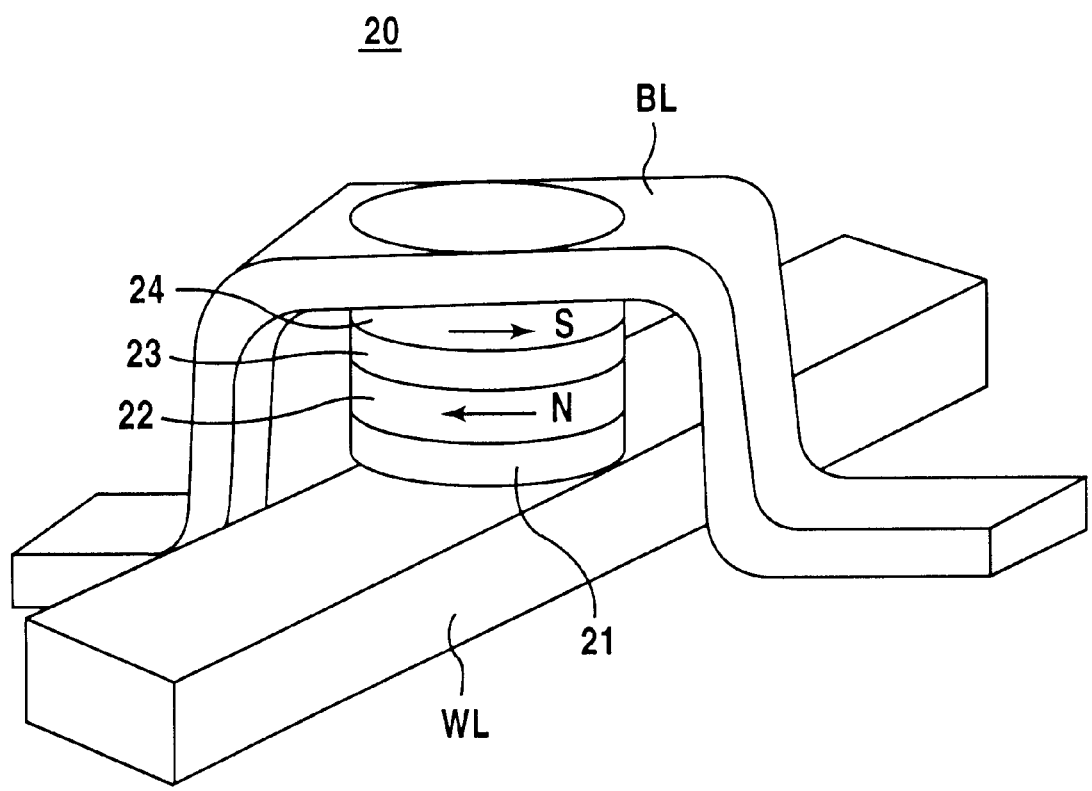
FIG. 3 is a diagram showing the structure of a conventional spin valve magnetic random access memory.
Figure 4A:
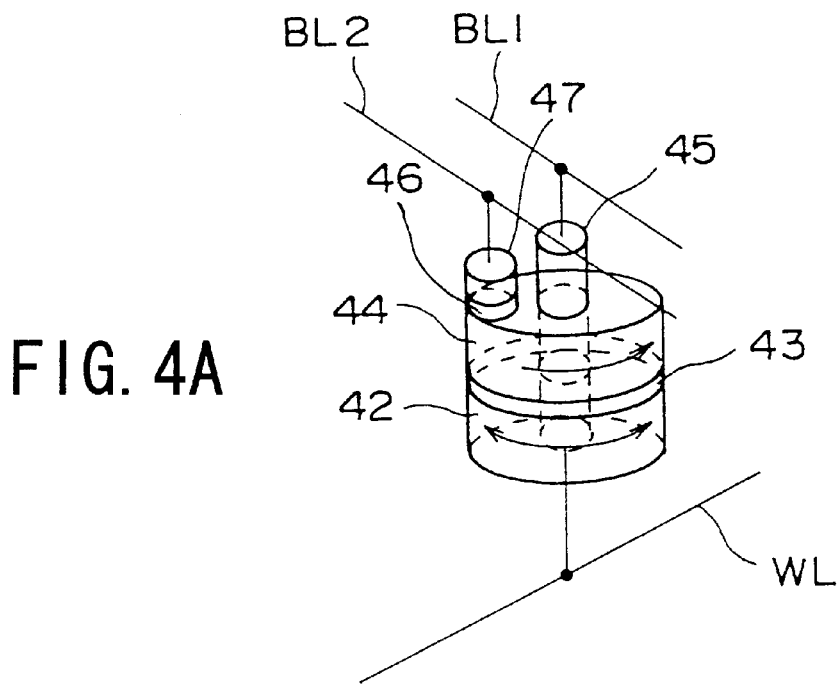
FIGS. 4A and 4B are diagrams showing the structure of a first embodiment of a magnetic random access memory according to the present invention.
Figure 4B:
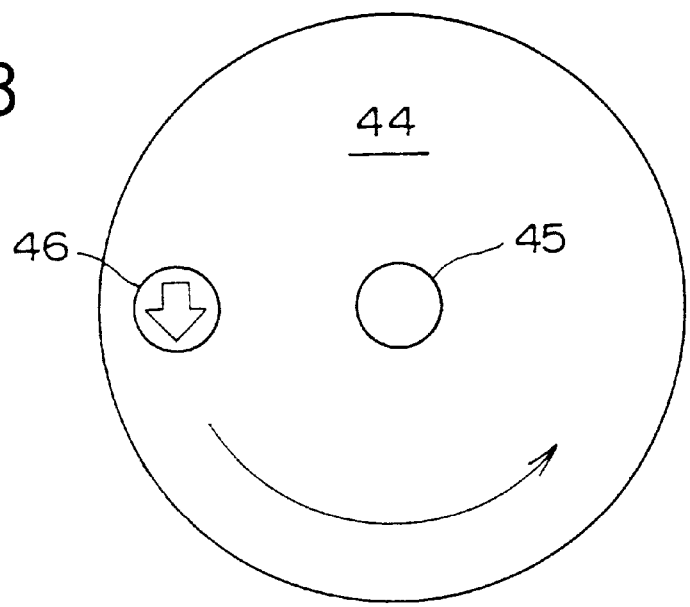

FIGS. 4A and 4B are diagrams showing the structure of a first embodiment of a magnetic random access memory according to the present invention. FIG. 4A shows a perspective view of a magnetic random access memory (MRAM) 40, and FIG. 4B shows a plan view of the MRAM 40.

As shown in FIG. 4A, the MRAM 40 includes a ferromagnetic ring 42 having a thickness of 20 nm, an inner diameter of 60 nm, and an outer diameter of 120 nm, for example. The ferromagnetic ring 42 has a stacked structure made up of a FeNi alloy layer and a Co layer. A tunnel insulator layer 43 is formed on the ferromagnetic ring 42. Typically, the tunnel insulator layer 43 has a thickness of 2 nm and is made of $Al_2O_3$ or the like. In a case where the tunnel insulator layer 43 is made of $Al_2O_3$, a thin Al layer having a thickness of several nm or less is deposited on the ferromagnetic ring 42, and the surface of this Al layer is naturally oxidized or plasma-oxidized. Generally, the tunnel insulator layer 43 which is formed in this manner is slightly deviated from the stoichiometric composition, and has a composition described by $AlO_x$. Furthermore, another ferromagnetic ring 44 having a structure similar to that of the ferromagnetic ring 42 is formed on the tunnel insulator layer 43, coaxially to the ferromagnetic ring 42.

In addition, the MRAM 40 shown in FIG. 4A includes a conductor plug 45 which penetrates the ferromagnetic ring 42, the tunnel insulator layer 43 and the ferromagnetic ring 44. The conductor plug 45 is made of a nonmagnetic metal such as W, Cu, Ag and Pt. A first bit line BL1 is connected to one end of the conductor plug 45, and a word line WL is connected to the other end of the conductor plug 45. By supplying a write current to the conductor plug 45, it is possible to magnetize the ferromagnetic ring 42 in a clockwise direction or a counterclockwise direction, as indicated by arrows in FIG. 4A.

An antiferromagnetic layer (pattern) 46 is formed on the ferromagnetic ring 44 at a portion avoiding the conductor plug 45, that is, at a portion away from a symmetry axis of the ferromagnetic ring 44. The antiferromagnetic layer 46 is made of a Mn-based antiferromagnetic material such as PtMn and PdPtMn. The magnetization direction within the ferromagnetic ring 44 is pinned in a direction indicated by an arrow in FIG. 4A by the antiferromagnetic layer 46.

FIG. 4B shows the pinning of the magnetization direction of the ferromagnetic ring 44 by the antiferromagnetic layer 46. The antiferromagnetic layer 46 as a whole does not display a magnetization. However, a magnetization in a direction indicated by a large arrow in FIG. 4B is generated at an interface of the antiferromagnetic layer 46 and the ferromagnetic ring 44 by applying a uniform external magnetic field. Hence, by magnetizing the ferromagnetic ring 44 within the magnetic field formed by the antiferromagnetic layer 46, the magnetization direction of the ferromagnetic ring 44 becomes counterclockwise as indicated by an arrow in FIG. 4B. Since the antiferromagnetic layer 46 as a whole does not display magnetization, the antiferromagnetic layer 46 is stable with respect to the external magnetic field. Hence, even when the write current is supplied to the conductor plug 45 and the magnetization of the ferromagnetic ring 42 is reversed, the magnetization direction of the ferromagnetic ring 44 will not change. In addition, because the closure magnetic field matches the magnetization in the circumferential direction within a ring-shaped ferromagnetic layer, it is possible to miniaturize the MRAM 40 without disturbing the magnetization direction. In other words, the MRAM 40 shown in FIGS. 4A and 4B is suited for high-density integration, and by forming a memory cell array by the MRAM 40 as will be described later, it is possible to form a high-speed nonvolatile memory device having an extremely large memory capacity.

Furthermore, in the MRAM 40, a nonmagnetic conductor plug 47 made of Cu, Pt, Ag or the like is formed on the antiferromagnetic layer 46 as shown in FIG. 4A. An other bit line BL2 which extends parallel to the bit line BL1 is connected to this nonmagnetic conductor plug 47.

When the magnetization direction within the ferromagnetic ring 42 matches the magnetization direction within the ferromagnetic ring 44, a tunnel current flows from the ferromagnetic ring 44 to the ferromagnetic ring 42 via the tunnel insulator layer 43, and a resistance between the second bit line BL2 and the word line WL takes a first value. On the other hand, when the magnetization direction within the ferromagnetic ring 42 is opposite to the magnetization direction within the ferromagnetic ring 44, no tunnel current flows through the tunnel insulator layer 43, and the resistance between the second bit line BL2 and the word line WL takes a second value which is larger than the first value. Accordingly, it is possible to read the information which is written in the MRAM 40 in the form of magnetization, by detecting the resistance between the word line WL and the second bit line BL2. According to the structure shown in FIGS. 4A and 4B, the conductor plug 45 is insulated with respect to the ferromagnetic ring 44, but the ferromagnetic ring 42 and the conductor plug 45 are electrically connected. But it is possible to insulate the ferromagnetic ring 42 and the conductor plug 45, and electrically connect the ferromagnetic ring 44 and the conductor plug 45 instead. A description related to the more detailed structure of the MRAM 40 will be given later in conjunction with a method of producing the MRAM.

As described above, when writing the information into the MRAM 40, a write current is supplied so that the write current flows from the word line WL towards the first bit line BL1 or from the first bit line BL1 towards the word line WL, so as to reverse the magnetization direction within the ferromagnetic ring 42. Since the magnetization of the ferromagnetic ring 44 is pinned by the antiferromagnetic layer 46 when writing the information s described above, the magnetization will not be reversed within the ferromagnetic ring 44.

Of course, the external shape of the ferromagnetic ring 42 or 44 is not limited to the circular shape in the MRAM 40 shown in FIGS. 4A and 4B. The ferromagnetic rings 42 and 44 may have any shape, such as generally ring shape or a polygonal shape, as long as the closure magnetic field is included thereby.

Figure 5:
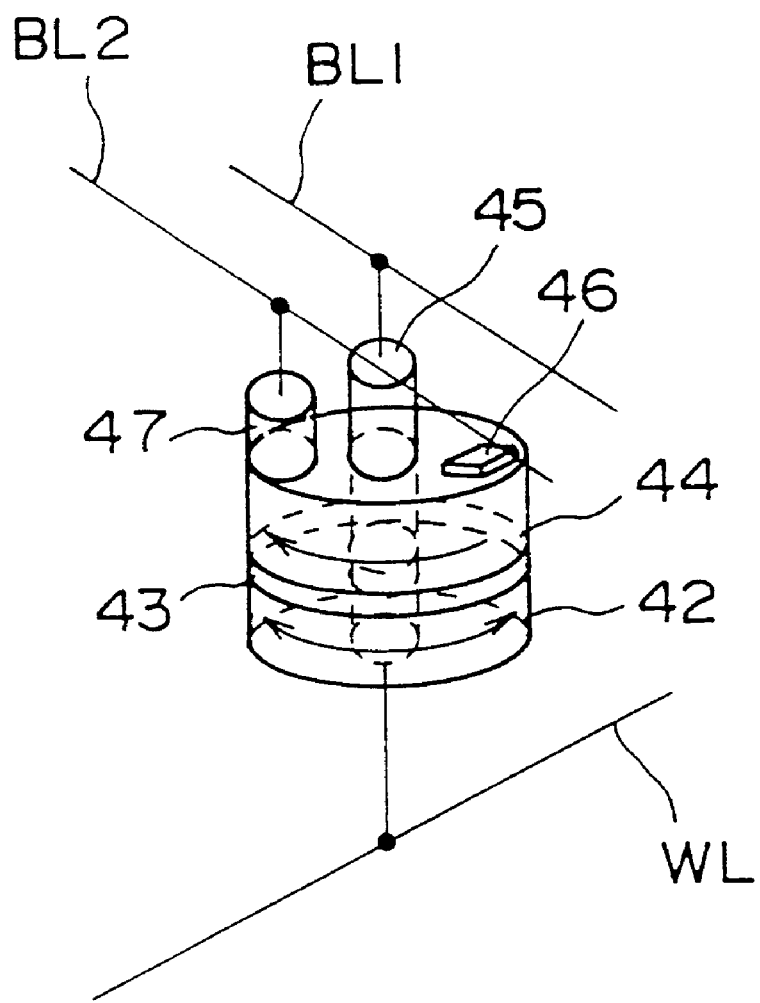
FIG. 5 is a diagram showing the structure of a modification of the first embodiment of the magnetic random access memory.

FIG. 5 is a diagram showing a modification of the first embodiment of the magnetic random access memory according to the present invention, that is, the MRAM 40 shown in FIGS. 4A and 4B. More particularly, FIG. 5 shows a perspective view of a MRAM 40A. In FIG. 5, those parts which are the same as those corresponding parts in FIGS. 4A and 4B are designated by the same reference numerals, and a description thereof will be omitted.

In the MRAM 40A shown in FIG. 5, the antiferromagnetic layer 46 and the nonmagnetic conductor plug 47 are formed at mutually different positions on the ferromagnetic ring 44. In other words, the nonmagnetic conductor plug 47 of this modification is formed directly on the ferromagnetic ring 44.

In the MRAM 40A, the magnetization direction of the ferromagnetic ring 44 is also pinned by the antiferromagnetic layer 46. Hence, it is possible to read the information written within the ferromagnetic ring 42 in the form of magnetization, by detecting a change in the resistance of the ferromagnetic tunnel junction due to the magnetization direction of the ferromagnetic ring 42. In addition, the information can be written in the MRAM 40A by supplying a write current to the conductor plug 34, similarly to the MRAM 40 shown in FIGS. 4A and 4B.

Figure 6:
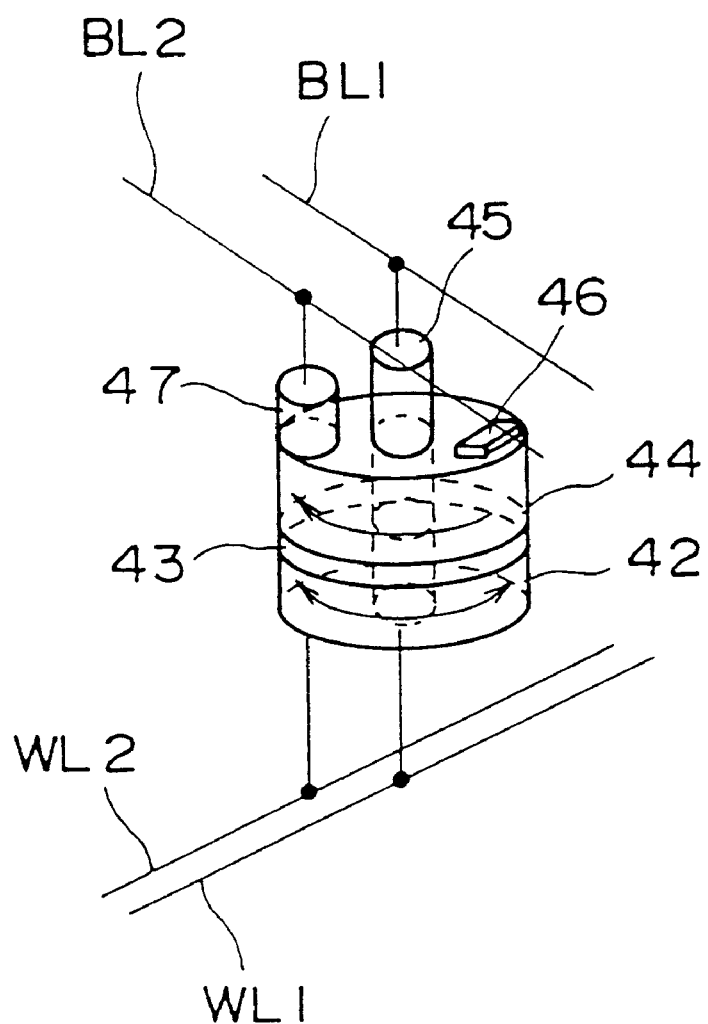
FIG. 6 is a diagram showing the structure of a second embodiment of the magnetic random access memory according to the present invention.

FIG. 6 is a diagram showing the structure of a second embodiment of the magnetic random access memory according to the present invention. More particularly, FIG. 6 shows a perspective view of a MRAM 40B. In FIG. 6, those parts which are the same as those corresponding parts in FIG. 5 are designated by the same reference numerals, and a description thereof will be omitted.

The MRAM 40B shown in FIG. 6 has a structure similar to that of the MRAM 40A shown in FIG. 5, but is provided with a pair of word lines WL1 and WL2 in place of the single word line WL. The first word line WL1 is connected to the conductor plug 45, and the second word line WL2 is connected to the ferromagnetic ring 42 via a conductor plug (not shown) similar to the conductor plug 47. The first word line WL1 is used when writing the information, and the second word line WL2 is used when reading the information. In other words, the write current flows to the conductor plug 45 and the information is written with respect to the ferromagnetic ring 42 by selecting the first word line WL1 and the first bit line BL1. On the other hand, by selecting the second word line WL2 and the second bit line BL2, it is possible to detect the resistance of a tunnel current path through the tunnel insulator layer 44, and to judge, based on the detected resistance, the content of the information which is written in the ferromagnetic ring 42 in the form of magnetization.

In other words, according to the MRAM 40B shown in FIG. 6, it is also possible to realize an operation similar to those of the MRAMs 40 and 40A described above.

Figure 7:
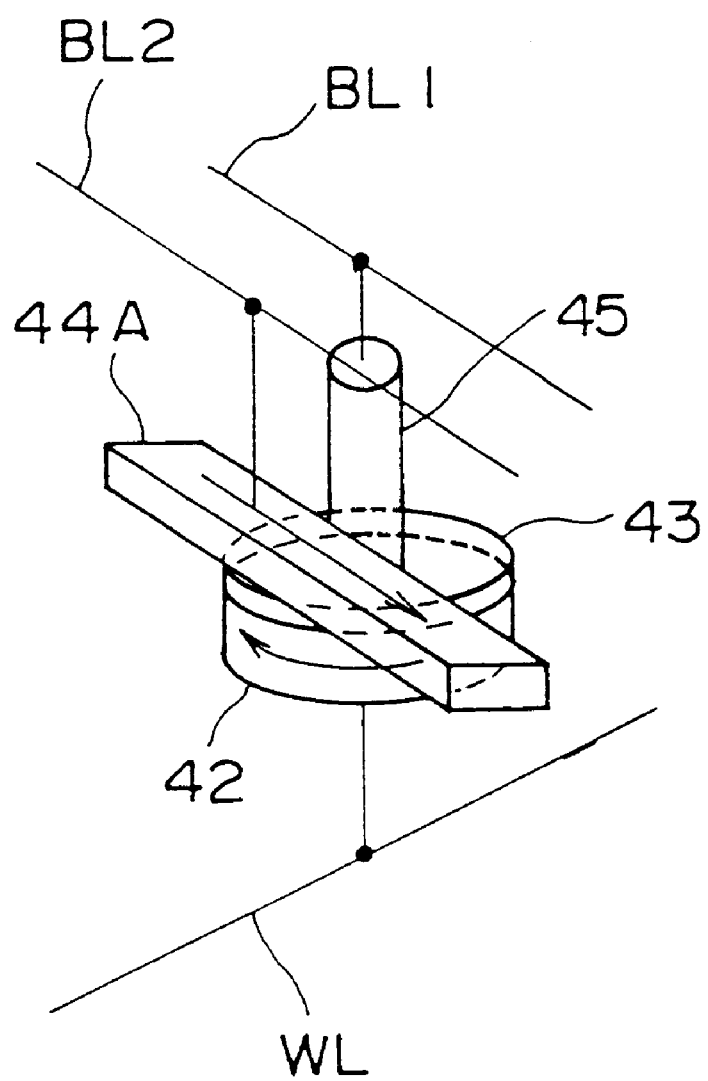
FIG. 7 is a diagram showing the structure of a third embodiment of the magnetic random access memory according to the present invention.

FIG. 7 is a diagram showing the structure of a third embodiment of the magnetic random access memory according to the present invention. More particularly, FIG. 7 shows a perspective view of a MRAM 40C. In FIG. 7, those parts which are the same as those corresponding parts in FIGS. 4A and 4B are designated by the same reference numerals, and a description thereof will be omitted.

The MRAM 40C shown in FIG. 7 has a structure similar to that of the MRAMs 40 and 40A shown in FIGS. 4A, 4B and 5, but is provided with a ferromagnetic pattern 44A in place of the ferromagnetic ring 44. This ferromagnetic pattern 44A is magnetized in a direction of an arrow shown in FIG. 7. The ferromagnetic pattern 44A extends in the magnetization direction, and is made of a ferromagnetic material having a larger coercivity than the ferromagnetic ring 42.

According to the MRAM 40C, the magnetization direction of the ferromagnetic pattern 44A will not change even when the write current is supplied to the conductor plug 45 and the magnetization direction of the ferromagnetic ring 42 is reversed. As a result, it is possible to realize a write operation and a read operation similar to those of the MRAMs 40 and 40A described above.

Figure 8:
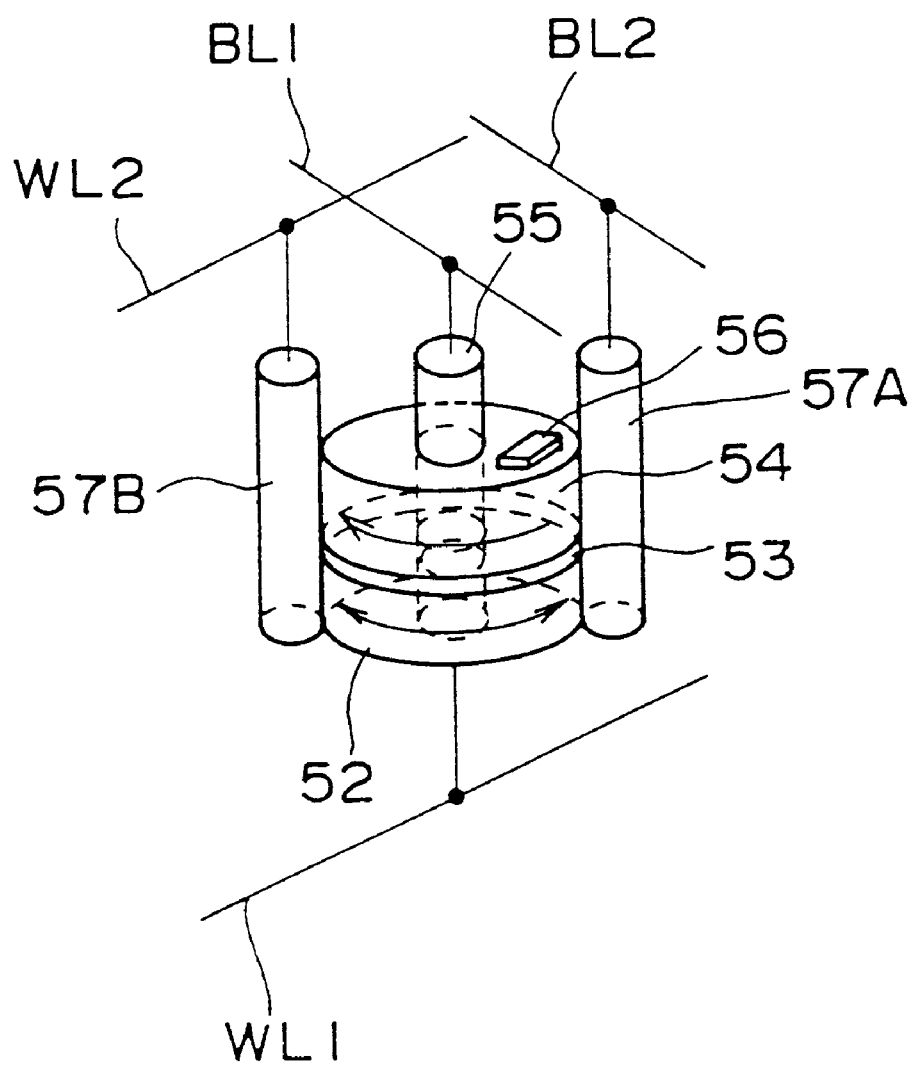
FIG. 8 is a diagram showing the structure of a fourth embodiment of the magnetic random access memory according to the present invention.

FIG. 8 is diagram showing the structure of a fourth embodiment of the magnetic random access memory according to the present invention. More particularly, FIG. 8 shows a perspective view of a spin valve MRAM 50.

The spin valve MRAM 50 shown in FIG. 8 includes a ferromagnetic ring 52 having a thickness of 20 nm, an inner diameter of 60 nm, and an outer diameter of 120 nm, for example. The ferromagnetic ring 52 has a stacked structure made up of a FeNi alloy layer and a Co layer. A nonmagnetic ring 53 is formed on the ferromagnetic ring 52. Typically, the nonmagnetic ring 53 has a thickness of 1.5 nm and is made of Al or Cu. Furthermore, another ferromagnetic ring 54 having a structure similar to that of the ferromagnetic ring 52 is formed on the nonmagnetic ring 53, coaxially to the ferromagnetic ring 52 and the nonmagnetic ring 53.

In addition, the MRAM 50 shown in FIG. 8 includes a conductor plug 55 which penetrates the ferromagnetic ring 52, the nonmagnetic ring 53 and the ferromagnetic ring 54. The conductor plug 55 is made of a nonmagnetic metal such as W, Cu, Ag and Pt. A first bit line BL1 is connected to one end of the conductor plug 55, and a first word line WL1 is connected to the other end of the conductor plug 55. By supplying a write current to the conductor plug 55, it is possible to magnetize the ferromagnetic ring 52 in a clockwise direction or a counterclockwise direction, as indicated by arrows in FIG. 8.

An antiferromagnetic layer (pattern) 56 is formed on the ferromagnetic ring 54 at a portion avoiding the conductor plug 55, that is, at a portion away from a symmetry axis of the ferromagnetic ring 54. The antiferromagnetic layer 56 is made of a Mn-based antiferromagnetic material such as PtMn and PdPtMn. The magnetization direction within the ferromagnetic ring 54 is pinned in a direction indicated by an arrow in FIG. 8 by the antiferromagnetic layer 56. In addition, the MRAM 50 shown in FIG. 8 includes conductor plugs 57A and 57B which are located at confronting positions of a spin valve junction structure which is made up of the rings 52 through 54, with respect to the symmetry axis.

A second bit line BL2 is connected to the conductor plug 57A, and a second word line WL2 is connected to the conductor plug 57B. The information written within the ferromagnetic ring 52 is read by detecting a magnetic resistance between the conductor plugs 57A and 57B via the second bit line BL2 and the second word line WL2. In the MRAM 50 shown in FIG. 8, the magnetic resistance is detected in a direction parallel to the surface of the nonmagnetic ring 53. Thus, compared to the conventional case where the magnetic resistance is detected in a direction perpendicular to the surface of the nonmagnetic ring 53, an absolute value of the detected magnetic resistance in the MRAM 50 increases, thereby enabling a highly sensitive detection of the magnetic resistance and improving the reliability of the information read by the read operation.

Because the ferromagnetic rings (layers) 52 and 54 which form the spin valve junction have the ring shape in this embodiment, it is possible to stably hold the magnetizations of the ferromagnetic rings 52 and 54 even when the MRAM 50 is miniaturized. In addition, since the antiferromagnetic layer 56 is formed at a portion of the ferromagnetic ring 54 avoiding the symmetry axis, it is possible to pin the magnetization of the ferromagnetic ring 54 in the circumferential direction.

Figure 9A:
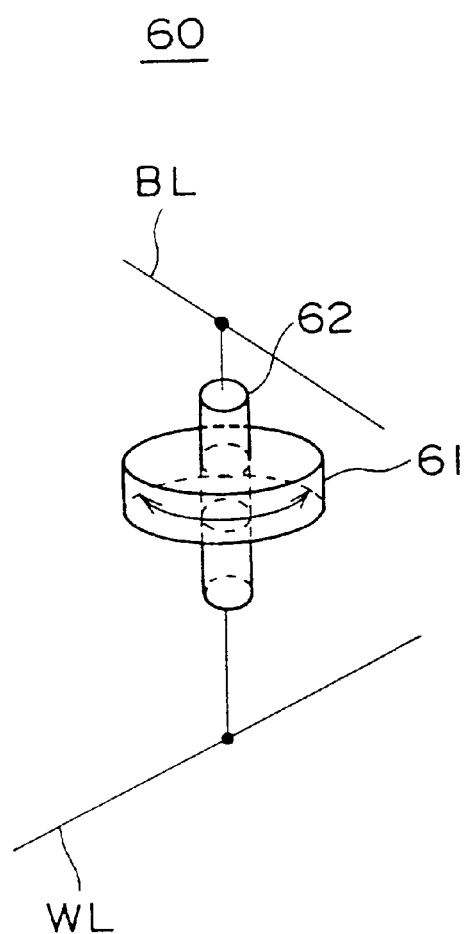
FIGS. 9A and 9B are diagrams for explaining the structure and operation of a fifth embodiment of the random access memory according to the present invention.
Figure 9B:
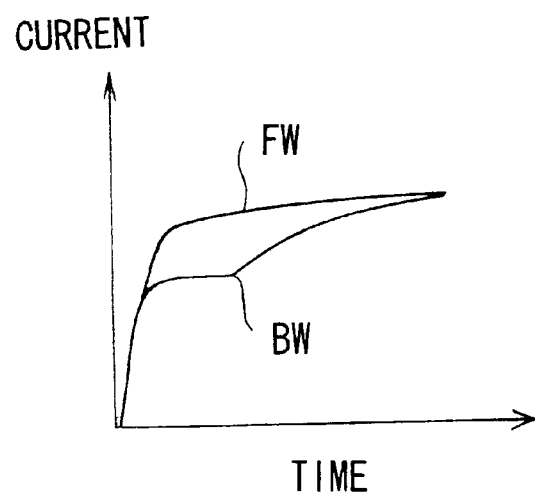

FIGS. 9A and 9B are diagrams for explaining the structure and operation of a fifth embodiment of the magnetic random access memory according to the present invention. More particularly, FIG. 9A shows a perspective view of a MRAM 60, and FIG. 9B shows a current versus time characteristic of the MRAM 60.

The MRAM 60 shown in FIG. 9A includes a single ferromagnetic ring 61, and a conductor plug 62 extends along the symmetry axis at a central portion of the ferromagnetic ring 61. Furthermore, a bit line BL is connected to one end of the conductor plug 62, and a word line WL is connected to the other end of the conductor plug 62. The ferromagnetic ring 61 is magnetized in a clockwise direction or a counterclockwise direction depending on the content of the written information.

The operating principle of the MRAM 60 will now be described by referring to FIG. 9B. In a case where the ferromagnetic ring 61 is magnetized in the clockwise direction, a write current rapidly rises with time as indicated by FW if the write current is supplied between the bit line BL and the word line WL in a forward direction so as to magnetize the ferromagnetic ring 61 in the clockwise direction to which the ferromagnetic ring 61 is already magnetized. On the other hand, if the write current is supplied in a reverse direction so as to reverse the magnetization direction of the ferromagnetic ring 61, the rise of the write current is delayed by a time corresponding to an energy which is required to reverse the magnetization direction, as indicated by BW. Accordingly, it is possible to read the information written within the MRAM 60 by detecting such a rising characteristic of the write current.

When the supplied current has a magnitude which will actually reverse the magnetization direction of the ferromagnetic ring 61, the information written in the ferromagnetic ring 61 is rewritten, and a read operation becomes a destructive read. But when the magnitude of the write current is limited to an extent such that the actual reversal of the magnetization direction of the ferromagnetic ring 61 will not occur, the information written in the ferromagnetic ring 61 is not rewritten, and a read operation becomes a nondestructive read.

Therefore, although the MRAM 60 has the simple structure shown in FIG. 9A, the MRAM 60 can operate as a nonvolatile random access memory.

Next, a description will be given of a first embodiment of a memory cell array according to the present invention, which uses the embodiments of the magnetic random access memory described above.

Figure 10A:
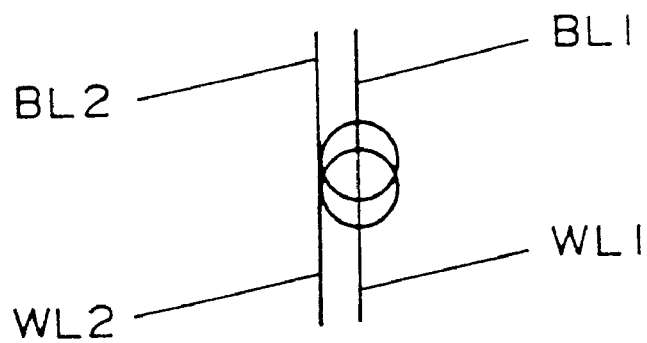
FIGS. 10A and 10B are diagrams for explaining symbols used in the present invention.
Figure 10B:
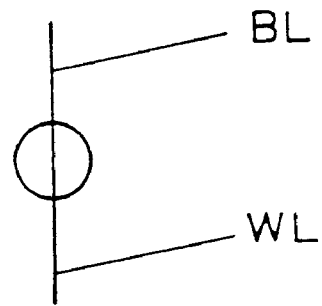

FIGS. 10A and 10B are diagrams for explaining symbols used in the present invention.

FIG. 10A shows a symbol which is made up of two partially overlapping circles, representing one of the MRAMs 40, 40A, 40B, 40C and 50. Although the symbol shown in FIG. 10A corresponds to the structure of the MRAM 40B shown in FIG. 6 or the MRAM 50 shown in FIG. 8 having two bit lines BL1 and BL2 and two word lines WL1 and WL2, the two word lines WL1 and WL2 may be connected when representing the MRAM 40, 40A or 40C shown in FIG. 4A, 5 or 7 having the single bit line BL and the single word line WL.

FIG. 10B shows a symbol which is made up of a single circle, representing the MRAM 60 shown in FIG. 9A.

Figure 11:
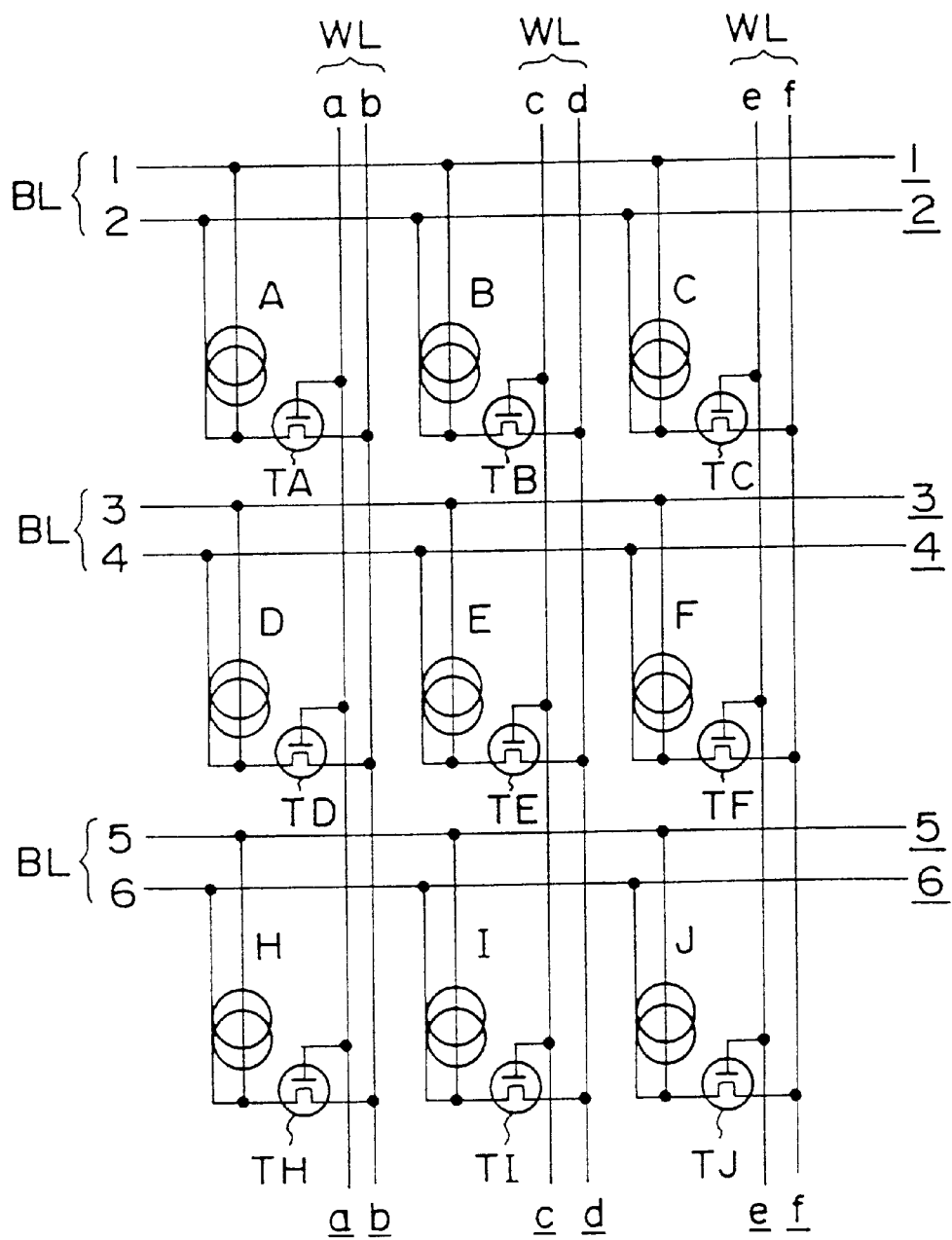
FIG. 11 is a diagram showing the structure of first embodiment of a memory cell array according to the present invention.

FIG. 11 is a diagram showing the structure of the first embodiment of the memory cell array. A memory cell array 70 shown in FIG. 11 includes memory cells A through J which are disposed in a matrix arrangement and have a structure corresponding to any one of the MRAMs 40 and 40A through 40C. The memory cells A, B and C which are arranged in a row direction are connected to common first and second bit lines 1 and 2, and the memory cells A, D and H which are arranged in a column direction are connected to a common first word line b. Similarly, the memory cells D, E and F which are arranged in the row direction are connected to common first and second bit lines 3 and 4, and the memory cells B, E and I which are arranged in the column direction are connected to a common first word line d. Furthermore, the memory cells H, I and J which are arranged in the row direction are connected to common first and second bit lines 5 and 6, and the memory cells C, F and J which are arranged in the column direction are connected to a common first word line f.

If the memory cells A through J were directly connected to the corresponding common bit lines 1 through 6 or the corresponding common word lines b, d and f, a write current or a read current would flow through the memory cell array 70 via the common bit line or the common word line and reach other memory cells. Hence, in the memory cell array 70 shown in FIG. 11, selection transistors TA through TJ are provided between the corresponding memory cells A through J and the corresponding common first word lines b, d and f. For example, the selection transistor TA is provided between the corresponding memory cell A and the corresponding common first word line b. The selection transistor TA is turned ON by a selection signal on a common second word line a, and in this case, the memory cell A becomes electrically connected to the common first word line b. When the write current is supplied to the first bit line 1 in this state, information which indicates "0" or "1" is written in the memory cell A depending on the polarity of the write current. In this state, the selection transistors TB and TC corresponding to the memory cells B and C which are also connected to the same common first bit line 1 as the memory cell A, are not turned ON. Hence, even if the write current is supplied to the common first bit line 1, no information is written in the memory cells B and C. In addition, a read current supplied from the common second bit line 2 will not be supplied to the memory cells B and C which are other than the selected memory cell A. The operation of the memory cell array 70 given above applies to all of the other embodiments of the memory cell array according to the present invention which will be described later.

Accordingly, by selecting one of the common word line pairs made up of the common word lines a and b, c and d, and e and f, and further selecting one of the bit line pairs made up of the common bit lines 1 and 2, 3 and 4, and 5 and 6, it is possible to write the information in an arbitrary one of the memory cells A through J and to read the information from the arbitrary one of the memory cells A through J. Since each of the memory cells A through J stores the information in the form of magnetization, the written information will not be lost even if the power supply to the memory cell array 70 is turned OFF.

Figure 12:
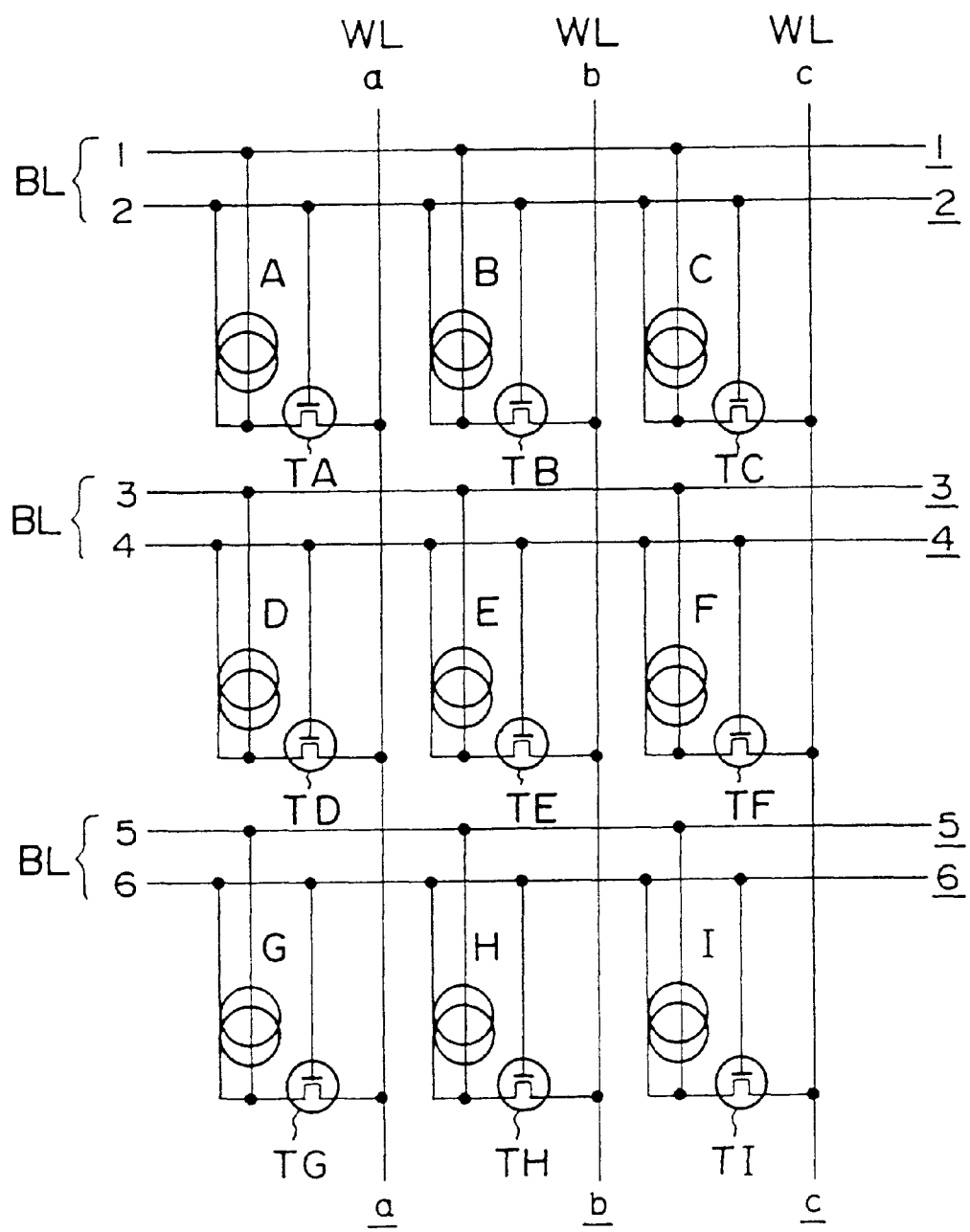
FIG. 12 is a diagram showing the structure of a second embodiment of the memory cell array according to the present invention.

FIG. 12 is a diagram showing the structure of a second embodiment of the memory cell array according to the present invention. In FIG. 12, those parts which are the same as those corresponding parts in FIG. 11 are designated by the same reference numerals, and a description thereof will be omitted.

In this embodiment, the selection transistors TA through TI of a memory cell array 80 shown in FIG. 12 are turned ON by a selection signal on the corresponding common second bit lines 2, 4 and 6. For example, when writing information in the memory cell A, the common second bit line 2 is selected to turn ON the selection transistor TA. When writing desired information in the memory cell A in this state, the common first bit line 1 and the common word line a are selected, and a write current is supplied to a write current path from the common first bit line 1 and reaching the common bit line a via the memory cell A.

On the other hand, when reading the information form the memory cell A, the common second bit line 2 is selected, the selection transistor TA is turned ON, and at the same time, the common word line a is selected. When reading the written information from the memory cell A in this state, a read current is supplied to a read current path from the common second bit line 2 and reaching the common word line a via the memory cell A. In this case, the selection transistors TB and TC are also turned ON, but no read current is supplied to the memory cells B and C since the common word lines b and c are not selected. In addition, no read current is supplied to the other memory cells D, E and F and the other memory cells G, H and I, because the common bit lines 3, 4, 5 and 6 are not selected.

According to this embodiment, the common second bit lines 2, 4 and 6 which are used when reading the information are used for the activation of the selection transistors TA through TI. Hence, it is possible to omit the common word lines b, d and f shown in FIG. 11 which are used for the activation of the selection transistors TA through TI. As a result, the structure of the memory cell array 80 can be simplified as compared to that of the memory cell array 70 shown in FIG. 11.

Figure 13:
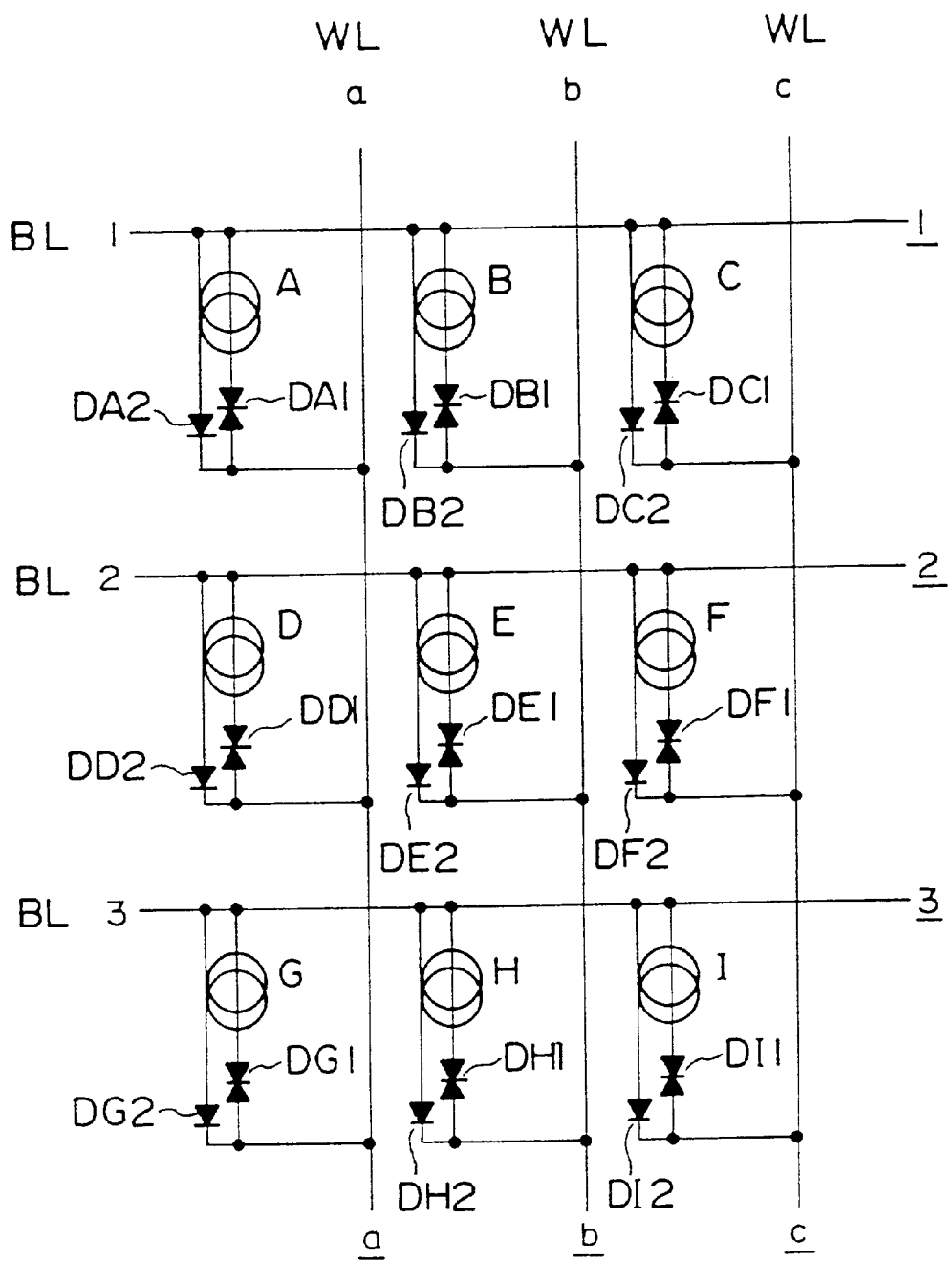
FIG. 13 is a diagram showing the structure of a third embodiment of the memory cell array according to the present invention.

FIG. 13 is a diagram showing the structure of a third embodiment of the memory cell array according to the present invention. In FIG. 13, those parts which are the same as those corresponding parts in FIG. 11 are designated by the same reference numerals, and a description thereof will be omitted.

In this embodiment, a memory cell array 90 shown in FIG. 13 includes first nonlinear elements DA1 through DI1 inserted in write current paths, and second nonlinear elements DA2 through DI2 inserted in read current paths, with respect to each of the memory cells A through I. Each of the first nonlinear elements DA1 through DI1 is made up of two diodes connected in mutually opposite directions, and each of the second nonlinear elements DA2 through D12 is made up of a single diode.

Figure 14:
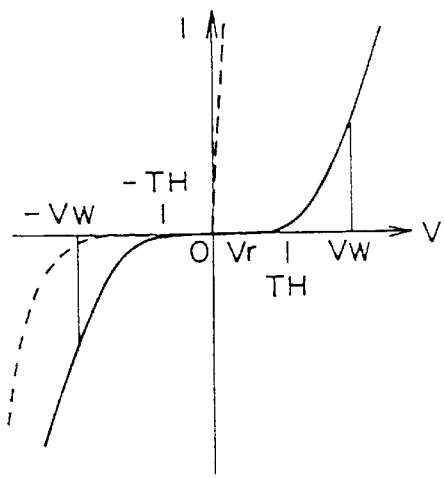
FIG. 14 is a diagram showing the characteristics of nonlinear elements used in a third embodiment of the memory cell array.

FIG. 14 is a diagram showing the characteristics of the first and second nonlinear elements DA1 and DA2. More particularly, FIG. 14 shows voltage-current (V-I) characteristics of the first and second nonlinear elements DA1 and DA2 for comparison purposes. In FIG. 14, the ordinate indicates the current (I), and the abscissa indicates the voltage (V). Further, a solid line indicates the characteristic of the first nonlinear element DAI, and a broken line indicates the characteristic of the second nonlinear element DA2.

As may be seen from FIG. 14, the first nonlinear element DA1 is characterized by a large threshold voltage TH, and the first nonlinear element DA1 will not conduct unless applied with a large write voltage +Vw or −Vw exceeding the threshold voltage TH. For this reason, when the write voltage +Vw or −Vw is applied to the common bit line 1 and the word line a is selected at the same time during the write operation mode, a write current flows to the word line a via the memory cell A, and desired information is written in the memory cell A. In this state, a large voltage drop corresponding to the threshold voltage TH is generated across both ends of the first nonlinear element DA1. For this reason, it is possible to prevent the write current from further passing through the second nonlinear element DD2 which cooperates with the memory cell D and returning to the common bit line 2, without providing the selection transistors TA through TI shown in FIG. 12 with respect to the memory cells A through I.

In addition, during the read operation mode, the common bit line 1 and the word line a are selected, for example, and a read voltage Vr shown in FIG. 14 which is lower than the threshold voltage TH of the first nonlinear element DA1 is applied to the selected common bit line 1. Hence, a read current flows through the second nonlinear element DA2, and the information written in the memory cell A can be read by detecting the resistance of the memory cell A based on the value of the read current. In this state, the read current which flows to the word line a via the second nonlinear element DA2 is prevented from flowing to the other memory cells. For example, the second nonlinear element DD2 which cooperates with the memory cell D blocks the current flowing to the word line a from flowing to the memory cell D.

Therefore, the memory cell array 90 shown in FIG. 13 only requires one word line and one bit line with respect to each memory cell, and the structure of the memory cell array 30 is extremely simple. Thus, the structure of the memory cell array 90 is particularly suited for a large scale memory cell array having the memory cells integrated with a high integration density.

Figure 15:
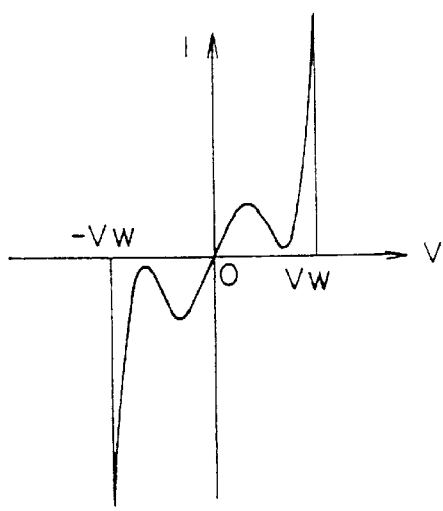
FIG. 15 is a diagram showing the characteristic of another nonlinear element used in the third embodiment of the memory cell array.

In this embodiment, each of the first nonlinear elements DA1 through DI1 is made up of the two diodes connected in the mutually opposite directions. However, it is of course possible to use for each of the first nonlinear elements DA1 through DI1 a negative resistance diode, such as a tunnel resonance diode having a characteristic shown in FIG. 15. In FIG. 15, the ordinate indicates the current (I), and the abscissa indicates the voltage (V).

Figure 16:
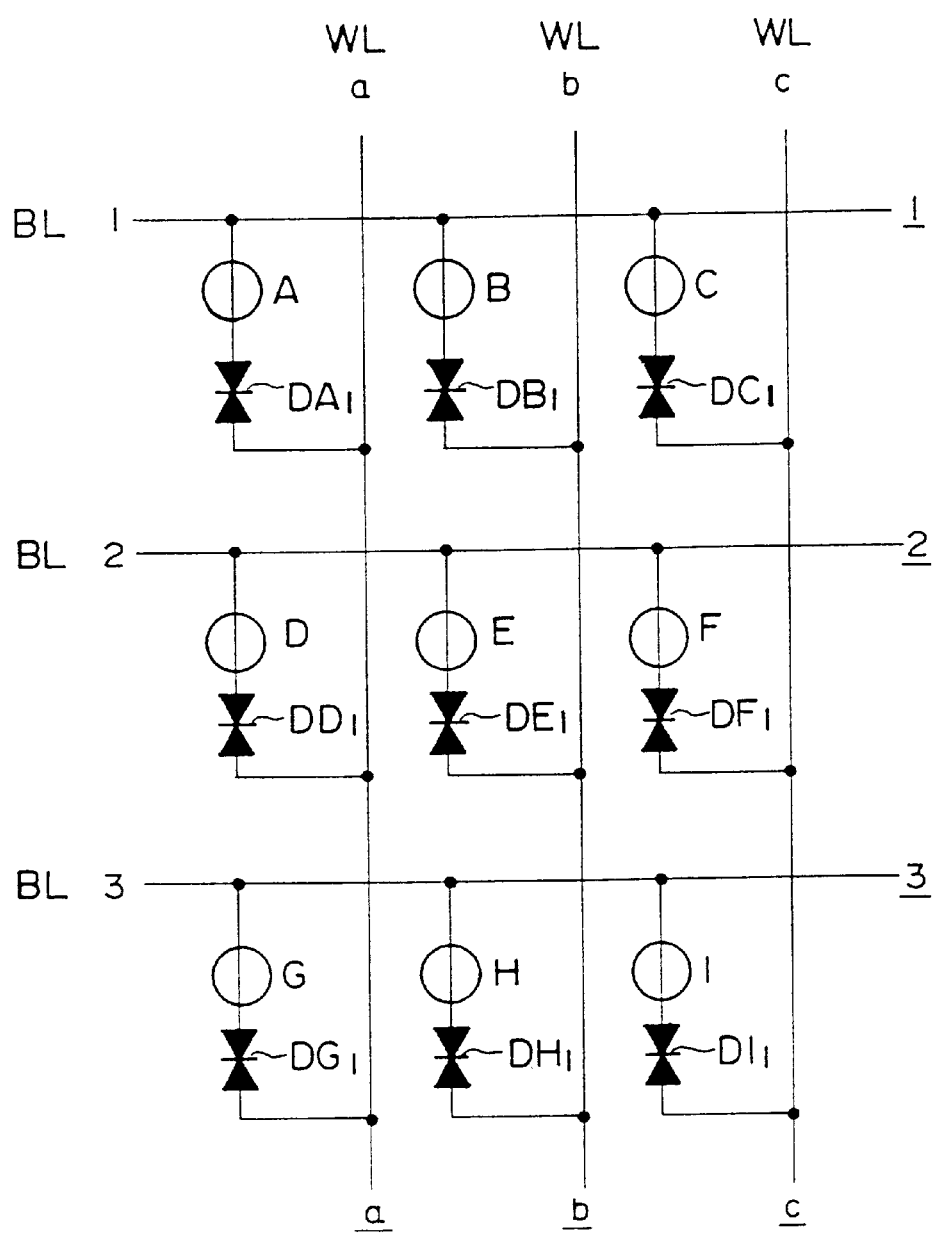
FIG. 16 is a diagram showing the structure of a fourth embodiment of the memory cell array according to the present invention.

FIG. 16 is a diagram showing the structure of a fourth embodiment of the memory cell array according to the present invention. In FIG. 16, those parts which are the same as those corresponding parts in FIG. 13 are designated by the same reference numerals, and a description thereof will be omitted.

In a memory cell array 100 shown in FIG. 16, the memory cells A, B and C which are arranged in the row direction and forming a group are connected in common to a single common bit line 1. On the other hand, the memory cells A, D and G which are arranged in the column direction and forming a group are connected in common to a single common word line a. Similar connections are made for a group of memory cells D, E and F and a group of memory cells G, H and I which are arranged in the row direction, and for a group of memory cells B, E and H and a group of memory cells C, F and I which are arranged in the column direction.

A nonlinear element made up of a pair of diodes connected in mutually opposite directions is connected between a memory cell and a corresponding word line. For example, the nonlinear element DA1 is connected between the memory cell A and the corresponding word line a. The nonlinear element DA1 has a current-voltage characteristic shown in FIG. 14 or 15, for example.

When the bit line 1 and the word line a are selected in the memory cell array 100 during the read operation mode, and a write voltage Vw which makes the nonlinear element DA1 conductive is applied to the selected bit line 1, a write current flows through the memory cell A and the ferromagnetic ring which forms the memory cell A is magnetized in a desired direction. On the other hand, when reading the written information from the memory cell A in the read operation mode, a rise of a read current which passes through the memory cell A and reaches the word line a is detected, as described above in conjunction with FIG. 9B. Hence, although not shown in FIG. 16, a comparator which compares a word line voltage and a reference voltage is connected to each of the word lines a, b and c. In this embodiment, the write current and the read current may be the same.

The write current or the read current which passes through the selected memory cell A and reaches the word line a, is also supplied to the other memory cells D and G which are connected to the same word line a. However, due to a predetermined voltage drop which occurs when the write current or the read current passes through the nonlinear element DA1, the nonlinear elements DD1 and DG1 which are respectively connected to the non-selected memory cells D and G will not become conductive, and no write current or read current will flow to the non-selected memory cells D and G.

Next, a description will be given of a method of producing the second embodiment of the memory cell array which is made up of the first embodiment of the magnetic random access memory according to the present invention, by referring to FIGS. 17A through 17L, 18A through 18J, and 19A through 19H. More particularly, FIGS. 17A through 17L, 18A through 18J, and 19A through 19H show a part of the memory cell array 80 shown in FIG. 12 which is made up of the MRAM 40 shown in FIGS. 4A and 4B. FIGS. 17A, 17C, 17E, 17G, 17I, 17K, 18A, 18C, 18E, 18G, 18I, 19A, 19C, 19E and 19G show plan views at various stages of the production process, and FIGS. 17B, 17D, 17F, 17H, 17J, 17L, 18B, 18D, 18F, 18H, 18J, 19B, 19D, 19F and 19H show cross sectional views at various stages of the production process.

As shown in FIGS. 17A and 17B, a field oxide layer 102 which defines an activation region 102A is formed on a surface of a Si substrate 101, and diffusion regions 101A and 101B are formed in the Si substrate 101 in correspondence with the activation region 102A. Further, a source electrode S is formed on the Si substrate 101 in correspondence with the diffusion region 101A so as to make ohmic contact therewith, and a drain electrode D is formed on the Si substrate 101 in correspondence with the diffusion region 101B so as to make ohmic contact therewith. A gate electrode G is formed on the Si substrate 101 between the diffusion regions 101A and 101B via a gate oxide layer. The illustration of this gate oxide layer is omitted. As shown in the plan view of FIG. 17A, the source electrode S extends continuously in the vertical direction and forms the word line a of the memory cell array 80 shown in FIG. 12. The source electrode S, the drain electrode D and the gate electrode G may be formed by sputtering a Cu layer, for example.

In the production stage shown in FIGS. 17C and 17D, a $SiO_2$ layer 103 is formed on the structure shown in FIGS. 17A and 17B so as to cover the source electrode S, the gate electrode G and the drain electrode D. The $SiO_2$ layer 103 may be formed by a CVD to a thickness of approximately 200 nm, for example. Then, in the production stage shown in FIGS. 17E and 17F, after planarization of a CMP process, a resist layer 104 is formed on the $SiO_2$ layer 103, typically, to a thickness of approximately 200 nm. A resist opening 104A corresponding to a central portion of the drain electrode D is formed in the resist layer 104 by photolithography. By dry-etching the $SiO_2$ layer 103 via the resist opening 104A, an opening which exposes the drain electrode D is formed in the $SiO_2$ layer 103. For example, the opening 104A is formed to a depth of approximately 200 nm.

Next, during the production stage shown in FIGS. 17G and 17H, a conductor layer 105 is sputtered on the resist layer 104. The conductor layer 105 is made of Cu, W or heavily doped polysilicon, and is deposited to a thickness of approximately 40 nm. Furthermore, in the production stage shown in FIGS. 17I and 17J, the conductor layer 105 is lifted off together with the resist layer 104. As a result, a conductor plug 105A having the same composition as the conductor layer 105 is formed on the drain electrode D in correspondence with the resist opening 104A.

Thereafter, in the production stage shown in FIGS. 17K and 17L, a $SiO_2$ layer 106 is formed on the structure shown in FIGS. 17I and 17J by a CVD using monosilane and oxygen, typically to a thickness of 100 nm. In addition, in the production stage shown in FIGS. 18A and 18B, the $SiO_2$ layer 106 is etched back, so as to form a sidewall oxide layer 106A around the conductor plug 105A.

Figure 18A:
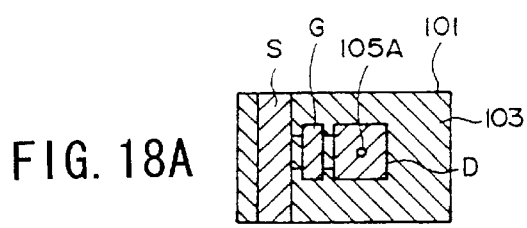
FIGS. 18A through 18J are diagrams for explaining the method of producing the second embodiment of the memory cell array.
Figure 18B:
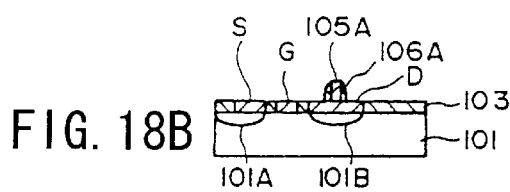
Figure 18C:
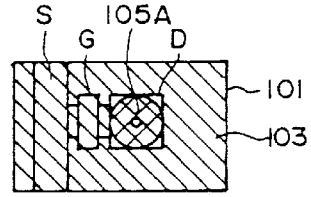
Figure 18D:
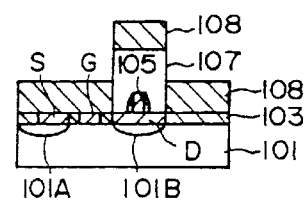

In the production stage shown in FIGS. 18C and 18D, a resist pattern 107 is formed so as to cover the conductor plug 105A and the sidewall oxide layer 106A, and a SiO$_2$ interlayer insulator 108 is deposited on the resist pattern 107 by a CVD. Then, in the production stage shown in FIGS. 18E and 18F, the SiO$_2$ interlayer insulator 108 is lifted off together with the resist pattern 107, and an opening 108A which exposes the conductor plug 105A is formed in the SiO$_2$ interlayer insulator 108.

Figure 18E:
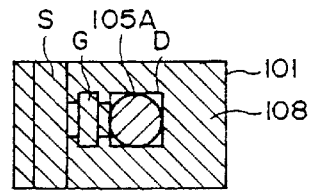
Figure 18F:
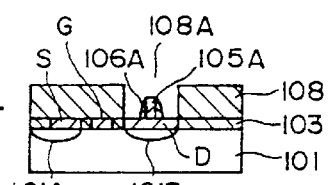
Figure 18G:
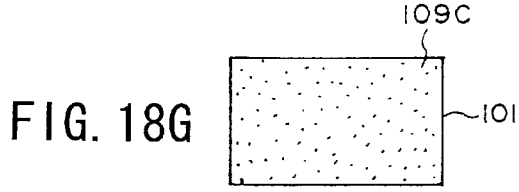
Figure 18H:
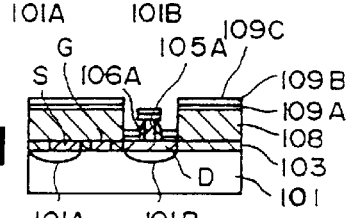

Next, in the production stage shown in FIGS. 18G and 18H, a FeNi alloy layer and a Co layer are deposited on the structure shown in FIGS. 18E and 18F by sputtering, so as to form a lower ferromagnetic layer 109A corresponding to the ferromagnetic ring 42 to a typical thickness of approximately 10 nm, and an extremely thin Al layer 109B is formed on the lower ferromagnetic layer 109A by sputtering to a thickness of approximately 2 nm or less. Moreover, the surface of the Al layer 109B is oxidized in a pure oxygen atmosphere, and an insulator layer having a composition generally described by AlO$_x$ is formed on the surface of the Al layer 109B as the tunnel insulator layer 43. In addition, a Co layer and a FeNi alloy layer are successively deposited by sputtering on the insulator layer (tunnel insulator layer 43), so as to form an upper ferromagnetic layer 109C which corresponds to the ferromagnetic ring 44 to a typical thickness of approximately 10 nm. As a result, a ring-shaped ferromagnetic tunnel junction structure (MTJ) similar to that of the MRAM 40 shown in FIGS. 4A and 4B is formed within the opening 108A of the SiO$_2$ interlayer insulator 108. The residual ferromagnetic layers 109A and 109C on the SiO$_2$ interlayer insulator 108 and the Al layer 109B interposed between the ferromagnetic layers 109A and 109C are polished and removed by a CMP process, to thereby obtain the structure shown in FIGS. 18I and 18J.

Figure 18I:
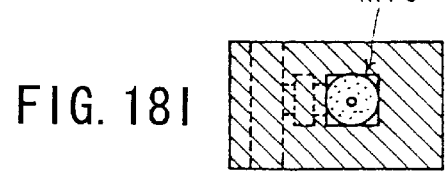
Figure 18J:
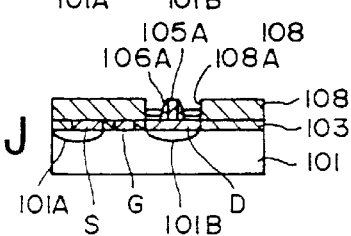
Figure 19A:
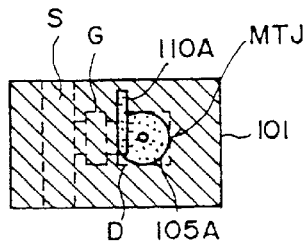
FIGS. 19A through 19H are diagrams for explaining the method of producing the second embodiment of the memory cell array.
Figure 19C:
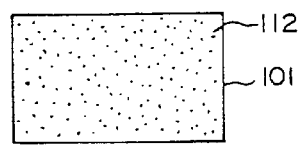
Figure 19E:
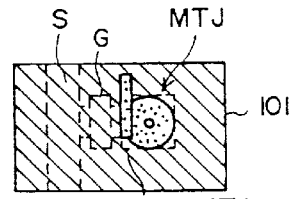
Figure 19G:
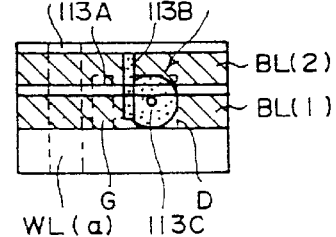
Figure 19B:
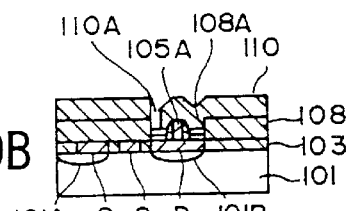

In the production stage shown in FIGS. 19A and 19B, a SiO$_2$ layer 110 is deposited on the structure shown in FIGS. 18I and 18J so as to fill the opening 108A. In addition, an opening 11NA which exposes the upper ferromagnetic layer 109C of the ferromagnetic tunnel junction structure MTJ is formed in the SiO$_2$ layer 110, at a position avoiding the symmetry axis of the ring-shaped ferromagnetic tunnel junction structure MTJ. In the production stage shown in FIGS. 19C and 19D, an antiferromagnetic layer 111 made of MnFe, PtMn or the like and a low-resistance conductor layer 112 made of Cu or the like are successively deposited on the structure shown in FIGS. 19A and 19B by sputtering. Typically, the antiferromagnetic layer 111 is deposited to a thickness of 10 nm, and the low-resistance conductor layer 112 is deposited to a thickness of 50 nm. As a result, an antiferromagnetic layer pattern 111A which corresponds to the antiferromagnetic layer (pattern) 46 on the ferromagnetic ring 44 is formed within the opening 110A. Furthermore, a low-resistance conductor plug 112A made of Cu or the like is formed on the antiferromagnetic layer pattern 111A within the opening 110A.

Figure 19D:
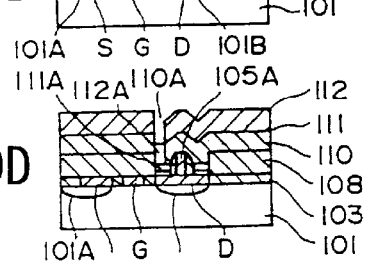
Figure 19F:
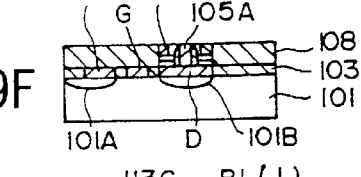

In the production stage shown in FIGS. 19E and 19F, a CMP process is carried out with respect to the structure shown in FIGS. 19C and 19D, so as obtain a structure with the interlayer insulator 108 exposed. In this structure, the conductor plug 112A is exposed on the planarized main surface of the interlayer insulator 108, and another interlayer insulator 113 is deposited on the structure shown in FIGS. 19E and 19F so as to cover the interlayer insulator 108. In addition, a contact hole 113A which penetrates the interlayer insulator 108 and exposes the gate electrode G, and a contact hole 113B which exposes the conductor plug 112A, are formed in the interlayer insulator 113. As shown in FIG. 19G, a bit line pattern BL(2) which extends in the horizontal direction is formed on the interlayer insulator 113 so as to cover the contact holes 113A and 113B, and patterned so as to form a common bit line BL(2) which corresponds to the bit line 2 shown in FIG. 12 and forms a portion of the gate electrode of the above described selection transistor and the read bit line BL2 shown in FIG. 4A. Moreover, an opening 113C is formed in the interlayer insulator 113 so as to expose the conductor plug 105A at a central portion of the ferromagnetic tunnel junction structure MTJ. A common bit line BL(1) which forms a portion of the write bit line BL1 shown in FIG. 4A is formed on the opening 113C in parallel to the common bit line BL(2).

Figure 19H:
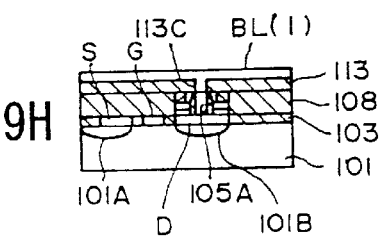

The structure shown in FIGS. 19G and 19H is subjected to a thermal process under an external magnetic field, so that the antiferromagnetic layer pattern 11A is magnetized in a desired direction, so as to pin the magnetization of the ferromagnetic ring 44 shown in FIG. 4A.

The other MRAMs, such as the MRAMs 40B and 40C shown in FIGS. 6 and 7, can be produced by similar processes. Further, when producing the spin valve MRAM 50 shown in FIG. 8, the surface oxidation is not carried out when depositing the Al layer (nonmagnetic layer) 109B in the structure shown in FIGS. 18G and 18H, and the upper ferromagnetic layer 109B can be formed directly on the Al layer 109B. Moreover, when producing the MRAM 60 shown in FIG. 9A, it is sufficient to deposit a single ferromagnetic layer on the structure shown in FIGS. 18G and 18H.

Next, a description will be given of another method of producing the second embodiment of the memory cell array which is made up of the first embodiment of the magnetic random access memory according to the present invention, by referring to FIGS. 20A through 20E, 21A through 21H and 22A through 22D. More particularly, FIGS. 20A through 20E, 21A through 21H and 22A through 22D show a part of the memory cell array 80 shown in FIG. 12 which is made up of the MRAM 40 shown in FIGS. 4A and 4B. FIGS. 20A, 20B, 20D, 21A, 21C, 21E, 21G, 22A and 22C show cross sectional views at various stages of the production process, and FIGS. 20C, 20E, 21B, 21D, 21F, 21H, 22B and 22D show plan views at various stages of the production process.

Figure 20A:
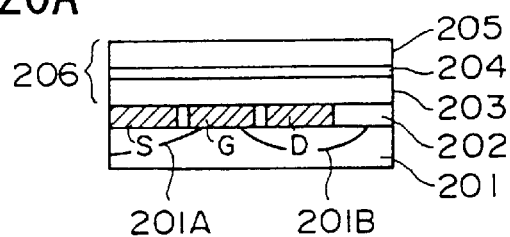
FIGS. 20A through 20D are diagrams for explaining another method of producing the second embodiment of the memory cell array.

In FIG. 20A, an insulator layer 202 is formed on a Si substrate 201, and a polysilicon gate electrode G and polysilicon source electrode S and drain electrode D on both sides of the polysilicon gate electrode G are embedded within the insulator layer 202. Diffusion regions 201A and 201B are formed in the Si substrate 201 in correspondence with the source electrode S. In the structure shown in FIG. 20A, the gate electrode G, the source electrode S and the drain electrode D are exposed at the surface of the insulator layer 202, and a ferromagnetic layer 203 is formed on the insulator layer 202. This ferromagnetic layer 203 has a stacked structure made up of a Co layer which is formed on a FeNi layer. Further, a nonmagnetic layer 204 preferably made of Al is formed on the ferromagnetic layer 203, and a ferromagnetic layer 205 is formed on the nonmagnetic layer 204. This ferromagnetic layer 205 has a stacked structure made up of a Co layer and a FeNi layer. The ferromagnetic layer 203, the nonmagnetic layer 204 and the ferromagnetic layer 205 form a stacked structure 206. A tunnel insulator layer having a composition described by AlO$_x$ and a thickness of approximately 2 nm or less is formed on the surface of the nonmagnetic layer 204.

Figure 20B:
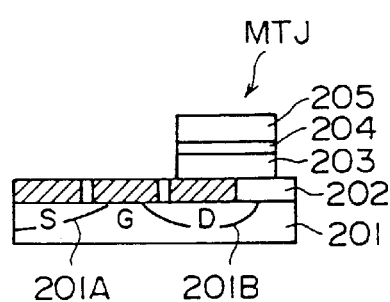
Figure 20C:
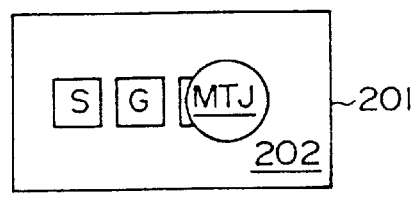

Next, in the production stage shown in FIGS. 20B and 20C, the stacked structure 206 shown in FIG. 20A is patterned, and a disk-shaped ferromagnetic tunnel junction structure MTJ is formed on the drain electrode D as may be seen from the plan view of FIG. 20C.

Figure 20D:
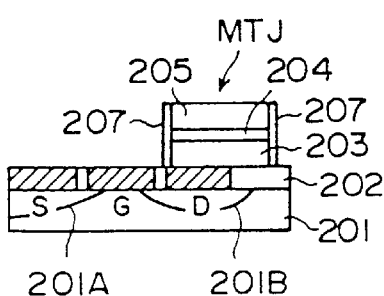
Figure 20E:
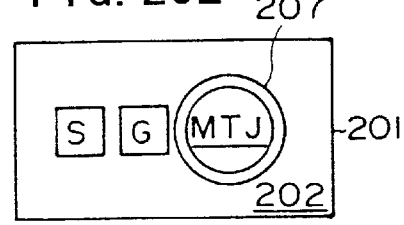

Moreover, in the production stage shown in FIGS. 20D and 20E, a sidewall insulator layer 207 made of $SiO_2$ is formed around the ferromagnetic tunnel junction structure MTJ shown in FIGS. 20B and 20C. In the production stage shown in FIGS. 21A and 21B, an antiferromagnetic layer 208 made of PtMn, FeMn or the like is formed on the structure shown in FIGS. 20D and 20E, so as to form an electrical contact with the upper ferromagnetic layer 205 of the ferromagnetic tunnel junction structure MTJ.

Figure 21A:
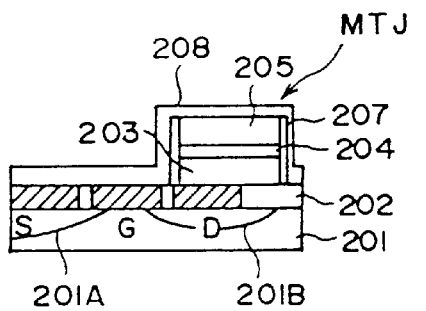
FIGS. 21A through 21H are diagrams for explaining the method of producing the second embodiment of the memory cell array.
Figure 21B:
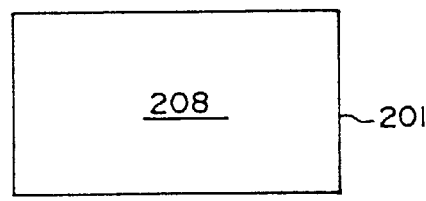
Figure 21C:
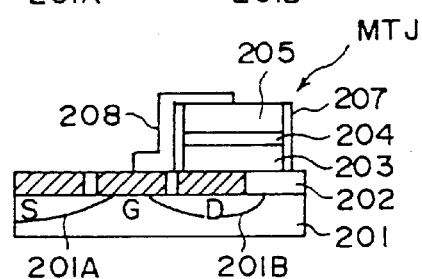
Figure 21D:
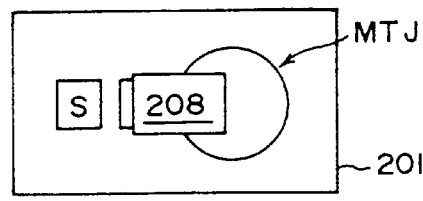

In addition, in the production stage shown in FIGS. 21C and 21D, the antiferromagnetic layer 208 is patterned, so as to electrically connect the gate electrode G and the ferromagnetic layer 205. However, the antiferromagnetic layer 208 is electrically insulated from the sidewall surface of the ferromagnetic tunnel junction structure MTJ by the provision of the sidewall insulator layer 207.

Figure 21E:
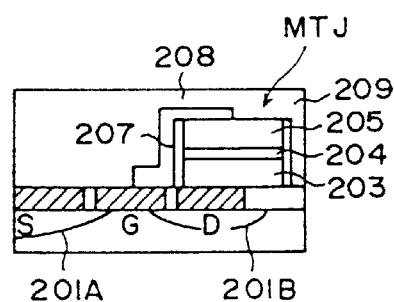
Figure 21F:
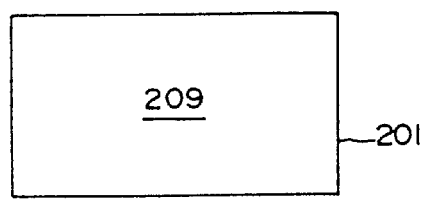
Figure 21G:
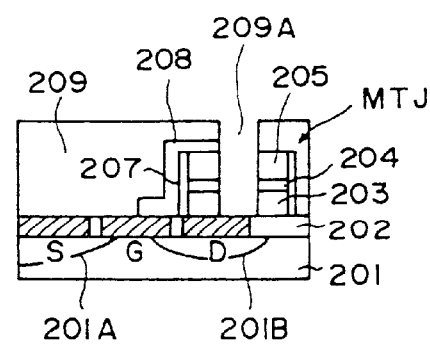
Figure 21H:
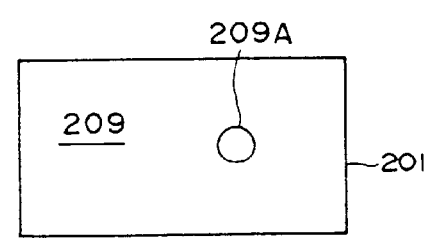

In the production process shown in FIGS. 21E and 21K, an interlayer insulator 209 made of $SiO_2$ or the like is formed on the structure shown in FIGS. 21C and 21D, and after carrying out a planarization using a CMP process, an opening 209A is formed in the production stage shown in FIGS. 21G and 21H. This opening 209A penetrates a central portion of the ferromagnetic tunnel junction structure MTJ, and exposes the drain electrode D.

Figure 22B:
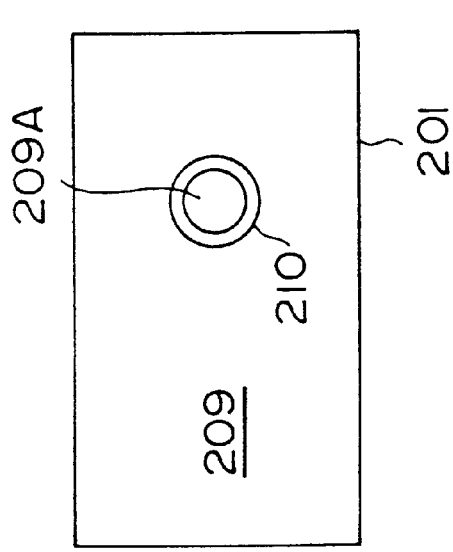
FIGS. 22A through 22D are diagrams for explaining the method of producing the second embodiment of the memory cell array.
Figure 22D:
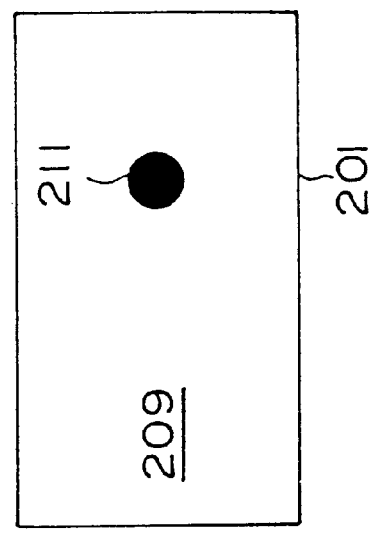
Figure 22A:
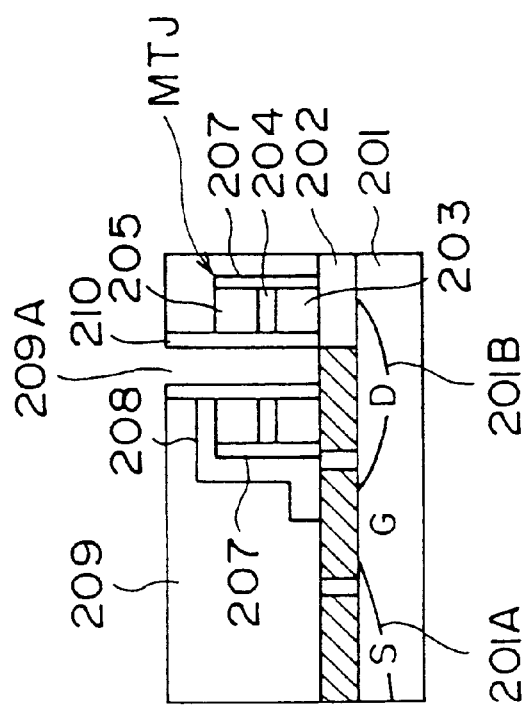
Figure 22C:
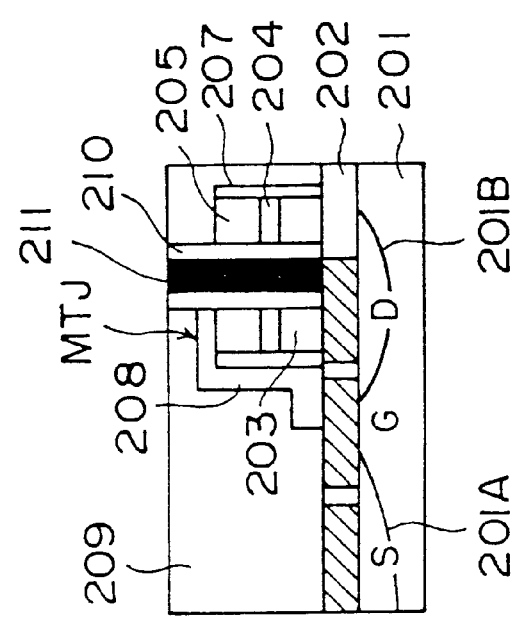

Then, in the production stage shown in FIGS. 22A and 22B, a sidewall insulator layer 210 is formed on the sidewall surface of the opening 209A. Moreover, in the production stage shown in FIGS. 22C and 22D, a conductor plug 211 made of W, Cu or the like is formed on the inner side of the sidewall insulator layer 210, within the opening 209A.

Therefore, the present invention can achieve the following effects.

First, when the random access memory is formed by use of the ferromagnetic tunnel junction or the spin valve junction, it is possible to prevent the magnetization direction of the ferromagnetic layer from changing due to the closure magnetic field even when the random access memory is considerably miniaturized, by forming the ferromagnetic layer which forms the ferromagnetic tunnel junction or the spin valve junction in the ring shape. As a result, it is possible to realize stable write and read operations. When magnetizing the ferromagnetic layer along the ring shape and pinning the magnetization, the present invention forms the antiferromagnetic layer pattern on a position of the pinned layer avoiding the symmetry axis. By employing such an arrangement and magnetizing the antiferromagnetic layer pattern in one direction, it is possible to pin the magnetization direction of the ring-shaped pinned layer in the clockwise or counterclockwise direction.

Second, although a portion of the write current path and the read current path can be formed independently with respect to the single ferromagnetic tunnel junction structure or spin valve junction, the present invention uses a portion in common between the two, so that the number of bit lines and word lines can be reduced when forming the memory cell array.

Third, it is possible to realize a magnetic random access memory having an extremely simple structure by use of a single ferromagnetic ring. Such a magnetic random access memory using the single ferromagnetic ring can be driven via a single bit line and a single word line, and the structure of the memory cell array made up of this magnetic random access memory can be made extremely simple. It is therefore possible to considerably improve the integration density of the memory cell array.

Fourth, by providing a switch such as a transistor or a nonlinear element such as a diode with respect to each memory cell made up of the magnetic random access memory in the memory cell array, it is possible to prevent the write current or the read current which is supplied to the selected memory cell from reaching the other non-selected memory cells which are connected to the same word line or the same bit line as the selected memory cell.

Further, the present invention is not limited to these embodiments, but various variations and modifications may be made without departing from the scope of the present invention.

What is claimed is:

1. A ferromagnetic tunnel junction random access memory comprising:

a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers;

a conductor plug penetrating the first ferromagnetic layer, the tunnel insulator layer and the second ferromagnetic layer along a center axis;

a first selection line coupled to a first end of the conductor plug; and a second selection line coupled to a second end of the conductor plug opposite to the first end, said first ferromagnetic layer having a generally ring shape surrounding the conductor plug and being insulated from the conductor plug, one of said first and second ferromagnetic layers including an antiferromagnetic layer pattern on a portion thereof, and wherein the antiferromagnetic layer pattern extends around the center axis for an angular range of 180 degrees or less.

2. The ferromagnetic tunnel junction random access memory as claimed in claim 1, wherein said first and second ferromagnetic layers have a generally ring shape surrounding the conductor plug.

3. The ferromagnetic tunnel junction random access memory as claimed in claim 1, wherein said conductor plug has a sidewall surface covered by an insulator layer.

4. The ferromagnetic tunnel junction random access memory as claimed in claim 1, further comprising:

a third selection line disposed on and electrically coupled to the first ferromagnetic layer at a position avoiding the conductor plug.

5. The ferromagnetic tunnel junction random access memory as claimed in claim 4, further comprising:

a fourth selection line disposed on and electrically coupled to the second ferromagnetic layer at a position avoiding the conductor plug.

6. The ferromagnetic tunnel junction random access memory as claimed in claim 4, wherein said second selection line comprises a conductor pattern which electrically connects the second end of the conductor plug and the second ferromagnetic layer.

7. The ferromagnetic tunnel junction random access memory as claimed in claim 6, wherein said antiferromagnetic layer pattern is disposed on the first ferromagnetic layer, and said third selection line is coupled to the first ferromagnetic layer via the antiferromagnetic layer pattern.

8. The ferromagnetic tunnel junction random access memory as claimed in claim 6, wherein said conductor pattern is disposed on a diffusion region which is formed in a semiconductor substrate.

9. The ferromagnetic tunnel junction random access memory as claimed in claim 8, wherein said diffusion region forms a portion of a transistor formed on the semiconductor substrate.

10. A ferromagnetic tunnel junction random access memory comprising:
a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers;
a conductor plug penetrating the first ferromagnetic layer, the tunnel insulator layer and the second ferromagnetic layer along a center axis;
a first selection line coupled to a first end of the conductor plug; and
a second selection line coupled to a second end of the conductor plug opposite to the first end,
said first ferromagnetic layer having a generally ring shape surrounding the conductor plug and being insulated from the conductor plug,
one of said first and second ferromagnetic layers having a coercivity larger than that of the other of said first and second ferromagnetic layers;
wherein one of said first and second ferromagnetic layers includes an antiferromagnetic layer pattern on a portion thereof; and
wherein the antiferromagnetic layer pattern extends around the center axis for an angular range of 180 degrees or less.

11. The ferromagnetic tunnel junction random access memory as claimed in claim 10, wherein said first and second ferromagnetic layers have a generally ring shape surrounding the conductor plug.

12. The ferromagnetic tunnel junction random access memory as claimed in claim 10, wherein said conductor plug has a sidewall surface covered by an insulator layer.

13. The ferromagnetic tunnel junction random access memory as claimed in claim 10, further comprising:
a third selection line disposed on and electrically coupled to the first ferromagnetic layer at a position avoiding the conductor plug.

14. The ferromagnetic tunnel junction random access memory as claimed in claim 13, further comprising:
a fourth selection line disposed on and electrically coupled to the second ferromagnetic layer at a position avoiding the conductor plug.

15. The ferromagnetic tunnel junction random access memory as claimed in claim 13, wherein said second selection line comprises a conductor pattern which electrically connects the second end of the conductor plug and the second ferromagnetic layer.

16. The ferromagnetic tunnel junction random access memory as claimed in claim 15, wherein said antiferromagnetic layer pattern is disposed on the first ferromagnetic layer, and said third selection line is coupled to the first ferromagnetic layer via the antiferromagnetic layer pattern.

17. The ferromagnetic tunnel junction random access memory as claimed in claim 15, wherein said conductor pattern is disposed on a diffusion region which is formed in a semiconductor substrate.

18. the ferromagnetic tunnel junction random access memory as claimed in claim 17, wherein said diffusion region forms a portion of a transistor formed on the semiconductor substrate.

19. A spin valve random access memory comprising:
a spin valve junction structure including a first ferromagnetic layer, a second ferromagnetic layer disposed adjacent to the first ferromagnetic layer and having a fixed magnetization, and a nonmagnetic conductor layer interposed between the first and second ferromagnetic layers;
a conductor plug extending along a center axis within the spin valve junction structure by penetrating the first ferromagnetic layer, the nonmagnetic conductor layer and the second ferromagnetic layer;
a first selection line coupled to a first end of the conductor plug;
a second selection line coupled to a second end of the conductor plug opposite to the first end;
a third selection line coupled to a first position on a sidewall surface of the spin valve junction structure; and
a fourth selection line coupled to a second position on the sidewall surface of the spin valve junction structure confronting to the first position,
said first ferromagnetic layer having a generally ring shape surrounding the conductor plug and being insulated from the conductor plug,
one of said first and second ferromagnetic layers having an antiferromagnetic layer pattern disposed thereon; and
wherein the antiferromagnetic layer pattern extends around the center axis for an angular range of 180 degrees or less.

20. The spin valve random access memory as claimed in claim 19, wherein said first and second ferromagnetic layers have a generally ring shape surrounding the conductor plug.

21. The spin valve random access memory as claimed in claim 19, wherein said conductor plug has a sidewall surface covered by an insulator layer.

22. A spin valve random access memory comprising:
a spin valve junction structure including a first ferromagnetic layer, a second ferromagnetic layer disposed adjacent to the first ferromagnetic layer and having a fixed magnetization, and a nonmagnetic conductor layer interposed between the first and second ferromagnetic layers;
a conductor plug extending along a center axis within the spin valve junction structure by penetrating the first ferromagnetic layer, the nonmagnetic conductor layer and the second ferromagnetic layer;
a first selection line coupled to a first end of the conductor plug;
a second selection line coupled to a second end of the conductor plug opposite to the first end;
a third selection line coupled to a first position on a sidewall surface of the spin valve junction structure; and
a fourth selection line coupled to a second position on the sidewall surface of the spin valve junction structure confronting to the first position,
said first ferromagnetic layer having a generally ring shape surrounding the conductor plug and being insulated from the conductor plug,
one of said first and second ferromagnetic layers having a coercivity larger than that of the other of said first and second ferromagnetic layers;
wherein one of said first and second ferromagnetic layers includes an antiferromagnetic layer pattern on a portion thereof; and wherein the antiferromagnetic layer pattern extends around the center axis for an angular range of 180 degrees or less.

23. The spin valve random access memory as claimed in claim 22, wherein said first and second ferromagnetic layers have a generally ring shape surrounding the conductor plug.

24. The spin valve random access memory as claimed in claim 22, wherein said conductor plug has a sidewall surface covered by an insulator layer.

25. A single ferromagnetic layer random access memory comprising:
a ferromagnetic layer;
a conductor plug penetrating a central portion of the ferromagnetic layer;
a first selection line coupled to a first end of the conductor plug; and
a second selection line coupled to a second end of the conductor plug opposite to the first end,
said ferromagnetic layer having a generally ring shape surrounding the conductor plug and being insulated from the conductor plug.

26. A single ferromagnetic layer random access memory as recited in claim 25, wherein
a magnetization of the ferromagnetic layer is readable by a current through the conductor plug, in a direction generating a magnetic field opposite to that of the ferromagnetic layer, the current having a nondestructive magnitude less than a rewriting current magnitude but greater than a reading magnitude.

27. A memory cell array comprising:
memory cells disposed in a matrix arrangement, each of said memory cells comprising a ferromagnetic tunnel junction random access memory comprising:
a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers;
a first selection line coupled to a first end of the conductor plug;
a second selection line coupled to a second end of the conductor plug opposite to the first end; and
a third selection line disposed on and electrically connected to the first ferromagnetic layer at a position avoiding the conductor plug,
said first ferromagnetic layer having a generally ring shape surrounding the conductor plug and being insulated from the conductor plug,
one of said first and second ferromagnetic layers including an antiferromagnetic layer pattern on a portion thereof or, having a coercivity larger than the other of said first and second ferromagnetic layers,
said second selection line comprising a conductor pattern which electrically connects the second end of the conductor plug and the second ferromagnetic layer;
a first common selection line extending in a first direction within the memory cell array;
a second common selection line extending in the first direction within the memory cell array in parallel to the first common selection line;
a third common selection line extending in a second direction different from the first direction within the memory cell array; and a switch coupled between the third common selection line and the second selection line with respect to each of the memory cells,
a first group of memory cells arranged in the first direction having the first selection line coupled to the first common selection line and the third selection line coupled to the second common selection line,
a second group of memory cells arranged in the second direction having the second selection line coupled to the third selection line;
wherein the antiferromagnetic layer pattern extends around the center axis for an angular range of 180 degrees or less.

28. The memory cell array as claimed in claim 27, further comprising:
a fourth common selection line extending parallel to the third common selection line within the memory cell array,
said switch comprising a transistor coupled to the fourth common selection line and conducting responsive to a signal on the fourth common selection line.

29. The memory cell array as claimed in claim 27, wherein said switch comprises a transistor coupled to the second common selection line and conducting responsive to a signal on the second common selection line.

30. A memory cell array comprising:
memory cells disposed in a matrix arrangement, each of said memory cells comprising a first diode, a second diode, and a ferromagnetic tunnel junction random access memory comprising:
a ferromagnetic tunnel junction structure including a first ferromagnetic layer, a second ferromagnetic layer disposed adjacent to the first ferromagnetic layer and having a fixed magnetization, and a tunnel insulator layer interposed between the first and second ferromagnetic layers;
a conductor plug penetrating the first ferromagnetic layer, the tunnel insulator layer and the second ferromagnetic layer along a center axis;
a first selection line coupled to a first end of the conductor plug;
a second selection line coupled to a second end of the conductor plug opposite to the first end;
a third selection line disposed on and electrically connected to the first ferromagnetic layer at a position avoiding the conductor plug; and
a fourth selection line disposed on and electrically connected to the second ferromagnetic layer at a position avoiding the conductor plug,
said first ferromagnetic layer having a generally ring shape surrounding the conductor plug and being insulated from the conductor plug,
one of said first and second ferromagnetic layers having an antiferromagnetic layer pattern on a portion thereof or, having a coercivity larger than the other of said first and second ferromagnetic layers,
a first common selection line extending in a first direction within the memory cell array;
a second common selection line extending in the a second direction different from the first direction within the memory cell array;
a switch coupled between the third common selection line and the second selection line with respect to each of the memory cells,
a first group of memory cells arranged in the first direction having the second and fourth selection lines coupled to the second common selection line, a second group of memory cells arranged in the second direction having the second selection line coupled to the third common selection line, said first diode being coupled between the second common selection line and the second selection line, said second diode being coupled between the second common selection line and the fourth selection line, said first and second diodes having mutually different characteristics.

31. The memory cell array as claimed in claim 30, wherein said first diode comprises a negative resistance diode.

32. A memory cell array comprising:

memory cells disposed in a matrix arrangement, each of said memory cells comprising a first diode, a second diode, and a spin valve random access memory comprising:

a spin valve junction structure including a first ferromagnetic layer, a second ferromagnetic layer disposed adjacent to the first ferromagnetic layer and having a fixed magnetization, and a nonmagnetic conductor layer interposed between the first and second ferromagnetic layers;

a conductor plug extending along a center axis within the spin valve junction structure by penetrating the first ferromagnetic layer, the nonmagnetic conductor layer and the second ferromagnetic layer;

a first selection line coupled to a first end of the conductor plug;

a second selection line coupled to a second end of the conductor plug opposite to the first end;

a third selection line coupled to a first position on a sidewall surface of the spin valve junction structure; and a fourth selection line coupled to a second position on the sidewall surface of the spin valve junction structure confronting to the first position, said first ferromagnetic layer having a generally ring shape surrounding the conductor plug and being insulated from the conductor plug, one of said first and second ferromagnetic layers having an antiferromagnetic layer pattern disposed thereon;

a first common selection line extending in a first direction within the memory cell array; and a second common selection line extending in a second direction different from the first direction within the memory cell array, a first group of memory cells arranged in the first direction having the first and third selection lines coupled to the first common selection line, a second group of memory cells arranged in the second direction having the second and fourth selection lines coupled to the second common selection line, said first diode being coupled between the second common selection line and the second selection line, said second diode being coupled between the second common selection line and the fourth selection line, said first and second diodes having mutually different characteristics.

33. The memory cell array as claimed in claim 32, wherein said first diode comprises a negative resistance diode.

34. A memory cell array comprising:

memory cells disposed in a matrix arrangement, each of said memory cells comprising a diode, and a single ferromagnetic layer random access memory comprising:

a ferromagnetic layer;

a conductor plug penetrating a central portion of the ferromagnetic layer;

a first selection line coupled to a first end of the conductor plug; and a second selection line coupled to a second end of the conductor plug opposite to the first end, said ferromagnetic layer having a generally ring shape surrounding the conductor plug and being insulated from the conductor plug;

a first common selection line extending in a first direction within the memory cell array; and a second common selection line extending in a second direction different from the first direction within the memory-cell array, a first group of memory cells arranged in the first direction having the first selection line coupled to the first common selection line, a second group of memory cells arranged in the second direction having the second selection line coupled to the second common selection line, said diode being coupled between the second common selection line and the second selection line.

35. The memory cell array as claimed in claim 34, wherein said diode comprises a negative resistance diode.

* * * * *